US012727187B2

(12) United States Patent
Tang et al.

(10) Patent No.: US 12,727,187 B2
(45) Date of Patent: Sep. 1, 2026

(54) INTEGRATED CIRCUIT WITH PATTERN OVERLAY FOR ASSISTING OVERLAY SIGNAL AND ACCURACY

(71) Applicant: Taiwan Semiconductor Manufacturing Co., Ltd., Hsinchu (TW)

(72) Inventors: Pei-Sheng Tang, Hsinchu (TW); Chen-Yen Kao, Hsinchu (TW); Jheng-Syun Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 420 days.

(21) Appl. No.: 18/482,758

(22) Filed: Oct. 6, 2023

(65) Prior Publication Data

US 2024/0405100 A1 Dec. 5, 2024

Related U.S. Application Data

(60) Provisional application No. 63/505,379, filed on May 31, 2023.

(51) Int. Cl.

| | |
|---|---|
| ***G03F 7/00*** | (2006.01) |
| ***H10D 30/01*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/83*** | (2025.01) |
| ***H10W 46/00*** | (2026.01) |

(52) U.S. Cl.
CPC ....... *H10D 30/024* (2025.01); *G03F 7/70033* (2013.01); *G03F 7/70633* (2013.01); *H10D 30/6735* (2025.01); *H10D 62/118* (2025.01); *H10D 64/017* (2025.01); *H10D 64/018* (2025.01); *H10D 84/0158* (2025.01); *H10D 84/038* (2025.01); *H10D 84/834* (2025.01); *H10W 46/00* (2026.01)

(58) Field of Classification Search
CPC ............ H10D 30/024; H10D 30/6735; H10D 62/118; H10D 64/017; H10D 64/018; H10D 84/0158; H10D 84/038; H10D 84/834; H10D 30/6757; H10D 62/151; G03F 7/70033; G03F 7/70633; H10W 46/00; H10W 46/301
See application file for complete search history.

(56) References Cited

U.S. PATENT DOCUMENTS

| | | | | |
|---|---|---|---|---|
| 6,812,506 | B1 | 11/2004 | Nariman et al. | |
| 2020/0043861 | A1 | 2/2020 | Chen et al. | |
| 2020/0135869 | A1 * | 4/2020 | Ciou | H10D 30/601 |

FOREIGN PATENT DOCUMENTS

| | | | |
|---|---|---|---|
| WO | 2018125212 | A1 | 7/2018 |

* cited by examiner

*Primary Examiner* — Thanhha S Pham
(74) *Attorney, Agent, or Firm* — Seed IP Law Group

(57) ABSTRACT

An integrated circuit includes a device region and an overlay mark region. The device region includes a plurality of stacked channels of a transistor, a source/drain region of the transistor, a source/drain contact of a first material on the source/drain region, and a conductive via of a second material in contact with the source/drain contact. The overlay mark region includes a first diffraction grating of first metal structures of the first material and a second diffraction grating of second metal structures above of the second material above and offset from the first metal structures.

20 Claims, 24 Drawing Sheets

INTEGRATED CIRCUIT WITH PATTERN OVERLAY FOR ASSISTING OVERLAY SIGNAL AND ACCURACY

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

However, as transistor features, and corresponding metal interconnect structures decrease in size, alignment tolerances decrease. As one example, conductive vias are utilized to contact source/drain contacts and gate electrodes. Misalignment of conductive vias can mean that the conductive vias do not contact the intended source/drain contact or gate electrode. Furthermore, metal lines are formed in metal layers (e.g., metal 0, metal 1 etc.) to contact the conductive vias. Misalignment of the metal layers in relation to the conductive vias, or to lower metal layers, can result in nonfunctioning integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
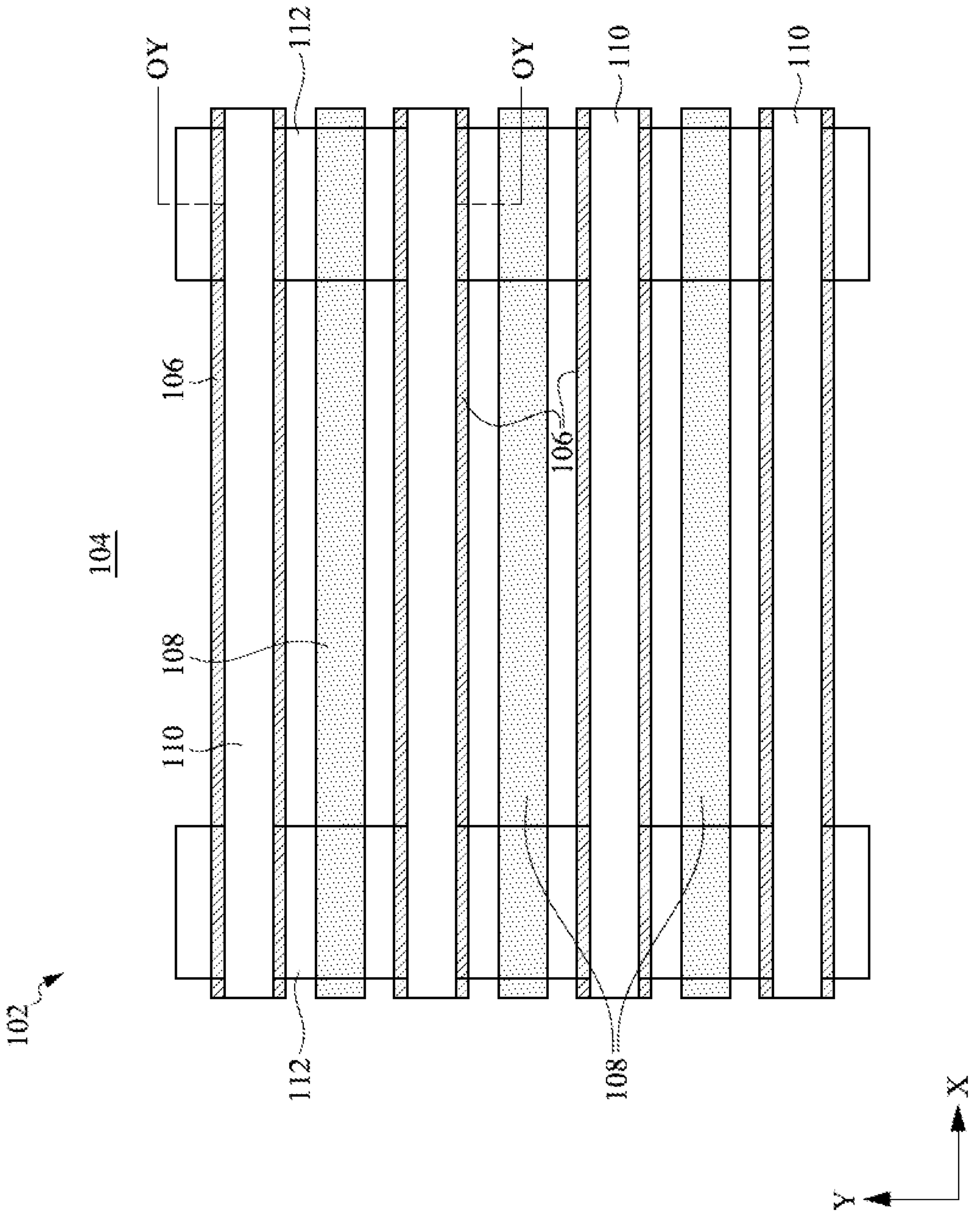
FIGS. 1A-1E are top views and cross-sectional views of an overlay mark region and a device region of an integrated circuit, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a method and structure for improved alignment of features in wafer processing. Embodiments of the present disclosure provide an enhanced overlay mark region that enables improved diffraction-based (scatterometry) overlay measurements for alignment of a subsequent mask. When a wafer is processed, the wafer includes a device area corresponding to the functional circuitry of an integrated circuit and an overlay mark region that includes periodic structures or gratings that are used for diffraction-based scatterometry to enable alignment for formation of subsequent features. The overlay region includes semiconductor fins spaced apart from each other and extending in a first direction, dummy gate structures positioned between the semiconductor fins and extending in a same direction, a grating of first metal structures of source/drain contact material aligned over the semiconductor fins, and a grating of second metal structures of a conductive via material aligned over the dummy gate structures at a level higher than the first metal structures.

The use of the grating of first metal structures in the overlay mark region assist in ensuring that the second metal structures have a selected height after a subsequent chemical mechanical planarization (CMP) process. The selected height is a height sufficient to ensure that a subsequent diffraction-based overlay measurement process provides a strong signal that can be used for proper alignment of a subsequent mask used to form metal lines that contact the source/drain vias. The proper alignment results in metal lines that are reliably formed in contact with conductive vias. If the grating of first metal structures is not present at the overlay mark region, then after the CMP process the second metal structures may not have a sufficient height to enable a strong diffraction-based overlay measurement signal. Accordingly, the use of the grating of first metal structures in the mask overlay region results in better functioning integrated circuits and higher wafer yields.

Figure 1B:
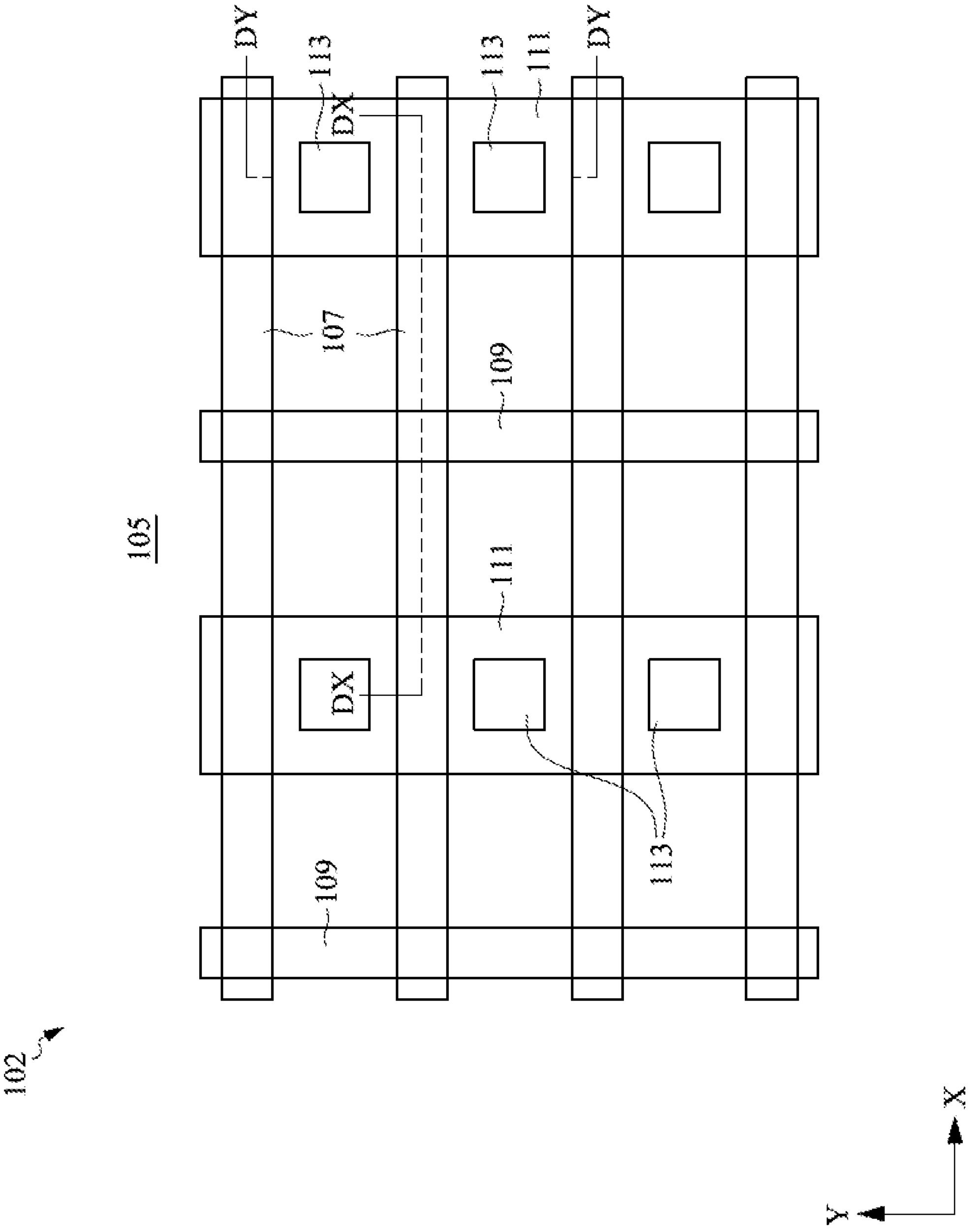

FIG. 1A is a top view of an integrated circuit 102 at an intermediate stage of processing, in accordance with some embodiments. More particularly, FIG. 1A is a top view of an overlay mark region 104 of the integrated circuit 102. FIG. 1B is a top view of a device region of the integrated circuit 102, in accordance with some embodiments. As will be set forth in more detail below, the components of the overlay mark region 104 are configured to collectively enable a diffraction-based overlay scan to be performed accurately in order to assist in aligning a subsequent mask used to form subsequent features.

Prior to describing the details of the overlay mark region 104 and the device region 105, it is beneficial to broadly describe the different functions of the device region 105 and the overlay mark region 104 The device region 105 includes the circuitry that makes up the integrated circuit. For example, when processing of the integrated circuit 102 is complete, the device region 105 may include a plurality of transistors including channel, source/drain, and gate regions. When processing of the device region 105 is complete, the device region 105 may include a plurality of metal layers stacked above the transistors and each formed on a respective interlevel dielectric layer. When processing of the device region 105 is complete, the device region 105 may include a plurality of conductive vias embedded in the interlevel dielectric layers and connecting source/drain contacts or gate contacts to metal zero (M0), the first metal layer to a second metal layer, and so forth.

When processing the integrated circuit 102, a large number of reticles (or masks) may be utilized to form patterns of features in the integrated circuit 102. Before using a reticle in a photolithography process with the integrated circuit 102, one or more alignment processes is performed. The alignment processes are performed so that the features formed in conjunction with the photolithography process will properly aligned with features that have already been formed in conjunction with previous reticles and photolithography processes.

The overlay mark region 104 assists in performing alignment processes throughout the processing of the integrated circuit 102. More particularly, the overlay mark region 104 assists in performing overlay diffraction-based (scatterometry) measurement processes to assist in alignment. The overlay mark region 104 includes multiple grating structures. The overlay diffraction-based process irradiates the overlay mark region 104 was selected wavelengths of light and measures the scattered light. The scattered light will have features based on the positions of the uppermost grating based on diffraction of the light from the grating. The features of the scattered light can help determine proper alignment for the next photolithography exposure.

The stage of processing shown in FIGS. 1A and 1B corresponds to a stage of processing in which source/drain regions of transistors have been formed, source/drain contact structures have been formed in contact with the source/drain regions, and conductive vias have been formed contacting the source/drain contact structures. A next stage of processing will be utilized to form a first metal layer including metal tracks that are in contact with the tops of the conductive vias. The structure of the overlay mark region 104 at the stage of processing shown in FIG. 1A will be utilized to ensure that an effective overlay diffraction-based process can be performed to align the next reticle so that subsequently formed metal tracks will be properly aligned and in contact with the conductive vias.

With reference to FIG. 1A, the overlay mark region 104 includes a plurality of semiconductor fins 106. The semiconductor fins 106 each extend in the X direction and are spaced apart from each other in the Y direction. Though not apparent in the view of FIG. 1A, the semiconductor fins 106 are positioned on a substrate. The semiconductor fins 106 have a pitch in the Y direction of between 10 nm and 50 nm, though other pitch values can be utilized without departing from the scope of the present application. The semiconductor fins 106 have a width in the Y direction of between 10 nm and 50 nm, though other pitch values can be utilized without departing from the scope of the present application. Details regarding the materials of the semiconductor fins 106 are provided further below. As will be described in more detail below, the semiconductor fins 106 are formed in a same process and of a same material as semiconductor fins from which the channels and source/drain regions of transistors will be formed in the device region 105.

The overlay mark region 104 includes a plurality of conductive structures 108 extending in the X direction and separated from each other in the Y direction. Though not shown in FIG. 1A, the conductive structures 108 are positioned on the substrate between adjacent semiconductor fins 106. The conductive structures 108 have a pitch in the Y direction between 10 nm and 50 nm, though other pitch values can be utilized without departing from the scope of the present application. Each conductive structure 108 has a width in the Y direction of between 10 nm and 50 nm, though other width values can be utilized without departing from the scope of the present application. The structures 108 can include polysilicon, or another material. As will be described in more detail below, the structures 108 are formed in the same material and the same process as dummy gate structures that will are in the device region 105 and that correspond to locations of gate metals that will subsequently be formed.

The overlay mark region 104 includes a grating of first metal structures 110. The first metal structures are positioned directly over the semiconductor fins 106. Though not shown in FIG. 1A, the first metal structures 110 are formed on a dielectric layer that overlies the semiconductor fins 106. The first metal structures 110 extend in the X direction and are separated from each other in the Y direction. The first metal structures 110 have a pitch of between 10 nm and 50 nm, though other pitch values can be utilized without departing from the scope of the present application. The first metal structures 110 each have a width in the Y direction of between 10 nm and 50 nm, though other width values can be utilized without departing from the scope of the present application. As will be described in more detail below, the first metal structures 110 are formed of a same material and in a same deposition process as source/drain contact metals that are formed in the device region 105.

The overlay mark region 104 includes a grating of second metal structures 112. The second metal structures 112 extend in the Y direction and are separated from each other in the X direction. Though not shown in FIG. 1A, the second metal structures 112 are formed above the first metal structures 110. The second metal structures 112 have a pitch of between 10 nm and 50 nm, though other pitch values can be utilized without departing from the scope of the present application. The second metal structures 112 have a width in the X direction of between 10 nm and 50 nm, though other width values can be utilized without departing from the scope of the present application. As will be described in more detail below, the second metal structures 112 have a same material and are formed in a same process as conductive vias that contact the source/drain contacts in the device region 105. The grating of second metal structures 112 in the overlay mark region 104 is the diffraction grating that will be used in the subsequent diffraction-based overlay measurement process to assist in alignment of the next reticle for the next photolithography process to form the first metal interconnect layer including metal interconnect structures in contact with conductive vias in the device region 105.

As will be described in more detail below, the presence of the grating of first metal structures 110 greatly enhances the effectiveness of the grating of second metal structures 112 in the diffraction-based overlay measurement process. In general, after formation of the second metal structures 112, a CMP process is performed to planarize the top surface and to remove any excess metal material from the top surface of the uppermost dielectric layer. The CMP process may correspond to a special type of CMP process in which the slurry material does not include potassium. If the grating of second metal structures 112 is not present below the first metal structures 110, it has been found that the thickness of the second metal structures 112 will be reduced to an extent that causes a subsequent diffraction-based overlay measurement process to provide a very poor scatterometry signal. The result is that a subsequent alignment process may fail to align features within the desired tolerance. The presence of the grating of first metal structures 110 below the second metal structures 112 ensures that during the subsequent CMP process the thickness of the second metal structures 112 will not be unduly reduced. This ensures that the second metal structures 112 retain a height that is sufficient to ensure that the subsequent diffraction-based overlay measurement process will have a strong signal that enables proper alignment.

With reference to FIG. 1B, the device region 105 includes semiconductor fins 107. The semiconductor fins 107 correspond to OD regions in which channel regions and source/drain regions of transistors will be formed. The semiconductor fins 107 extends in the X direction and are separated from each other in the Y direction. The semiconductor fins 107 are initially formed in a same process that forms the semiconductor fins 106 of the overlay mark region, though subsequent processing changes the composition of the semiconductor fins 107, as will be described in more detail below.

The device region 105 includes conductive structures 109. The conductive structures 109 correspond to the location at which gate metals will be formed in subsequent processes. Though not shown in FIG. 1B, the conductive structures 109 are formed on a same substrate as the semiconductor fins 107. However, the conductive structures 109 are formed after the semiconductor fins 107 and overly the semiconductor fins 107 when they cross the semiconductor fins 107. The conductive structures 109 may be described as dummy gate structures.

The device region 105 includes source/drain contacts 111. The source/drain contacts 111 overlie and are in contact with the source/drain regions (not shown in FIG. 1B) formed in the semiconductor fins 107. The source/drain contacts 111 are the same material and formed in a same deposition process as the first metal structures 110 of the overlay mark region 104.

The device region 105 includes conductive vias 113. The conductive vias 113 are in contact with the top of the source/drain contacts 111 and provide electrical connection to the source/drain contacts 111. The conductive vias 113 are formed in a same process and are the same material as the second metal structures 112.

Figure 1C:
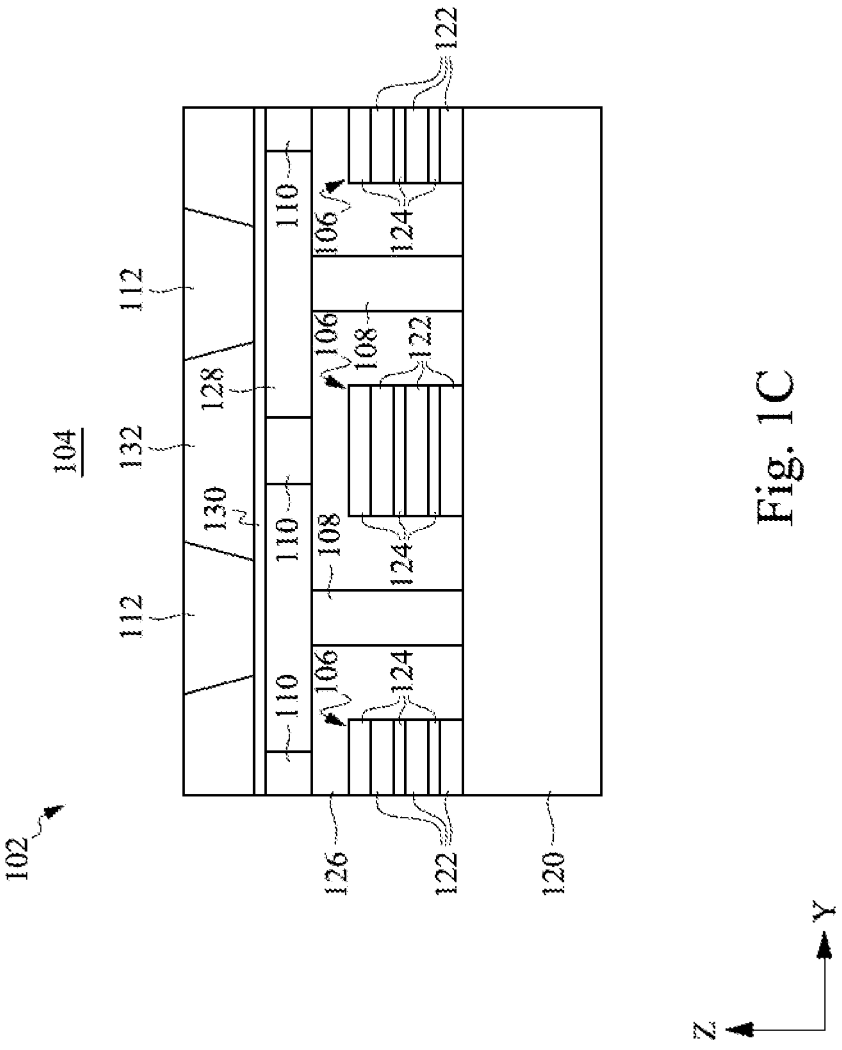

FIG. 1C is a cross-sectional view of the overlay mark region 104 taken along cut lines OY, in accordance with some embodiments. The integrated circuit includes a substrate 120. The substrate 120 may be a semiconductor substrate, such as a bulk semiconductor, or the like, which may be doped (e.g., with a p-type or an n-type dopant) or undoped. The semiconductor material of the substrate 120 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

The semiconductor fins 106 are positioned on the substrate 120 and include a plurality of semiconductor layers 124 and sacrificial semiconductor layers 122 alternating with each other. In some embodiments, the semiconductor layers 124 may be formed of a first semiconductor material suitable for semiconductor nanostructure transistors, such as silicon, silicon germanium, silicon carbide, or the like, and the sacrificial semiconductor layers 122 may be formed of a second semiconductor material that is selectively etchable with respect to the material of the semiconductor layers 124, such as silicon germanium, silicon, or the like. Each of the layers of the semiconductor fin 106 may be epitaxially grown using a process such as chemical vapor deposition (CVD), atomic layer deposition (ALD), vapor phase epitaxy (VPE), molecular beam epitaxy (MBE), or the like.

The conductive structures 108 are positioned on the substrate 120. The conductive structures 108 are positioned between the semiconductor fins 106. An interlevel dielectric layer 126 is positioned on the semiconductor fins 106, on the substrate 120 between the semiconductor fins 106 and the conductive structures 108, and has a top surface substantially coplanar with the top surface of the conductive structures 108. The interlevel dielectric layer 126 can include silicon oxide silicon nitride, SiCO, SiCN, SiCON, or other suitable dielectric materials.

The first metal structures 110 are positioned directly above the semiconductor fins 106 and around the top surface of the dielectric layer 126. The first metal structures 110 can include Al, W, Ti, TiN, Ta, Co, or other suitable conductive materials. The first metal structures 110 can have a height in the Z direction between 5 nm and 100 nm, though other height values can be utilized without departing from the scope of the present application. Other materials and thicknesses can be utilized for the first metal structures 110 without departing from the scope of the present disclosure.

The integrated circuit 102 includes an interlevel dielectric layer 128 on the dielectric layer 126. The interlevel dielectric layer 128 can include silicon oxide silicon nitride, SiCO, SiCN, SiCON, or other suitable dielectric materials. The interlevel dielectric layer 128 may have a top surface that is substantially coplanar with a top surface of the metal structures 110.

The integrated circuit 102 includes a dielectric layer 130 on the interlevel dielectric layer 128 and on the metal structures 110. The dielectric layer 128 can include silicon nitride or other suitable dielectric materials.

The integrated circuit 102 includes an interlevel dielectric layer 132 on the dielectric layer 130. The interlevel dielectric layer 132 can include silicon oxide silicon nitride, SiCO, SiCN, SiCON, or other suitable dielectric materials.

The second metal structures 112 are positioned on the dielectric layer 130 and/or embedded within the dielectric layer 132. The second metal structures 112 are offset laterally from the first metal structures 110. The second metal structures 112 can include W, Ti, Ta, TiN, TaN, Al, Co, Ru, or other suitable conductive materials. The second metal structures 112 have a height in the Z direction between 10 nm and 200 nm, though other height values can be utilized without departing from the scope of the present application. The second metal structures 112 have a top surface that is substantially coplanar with the top surface of the interlevel dielectric layer 132. This is a result of the special CMP process described previously. The special CMP process may use a slurry that does not include potassium. As described previously, the presence of the metal structures 110 below the metal structures 112 helps ensure that the metal structures 112 will have a sufficient height after a CMP process to ensure that a subsequent diffraction-based overlay measurements process can be completed successfully for alignment.

Figure 1E:
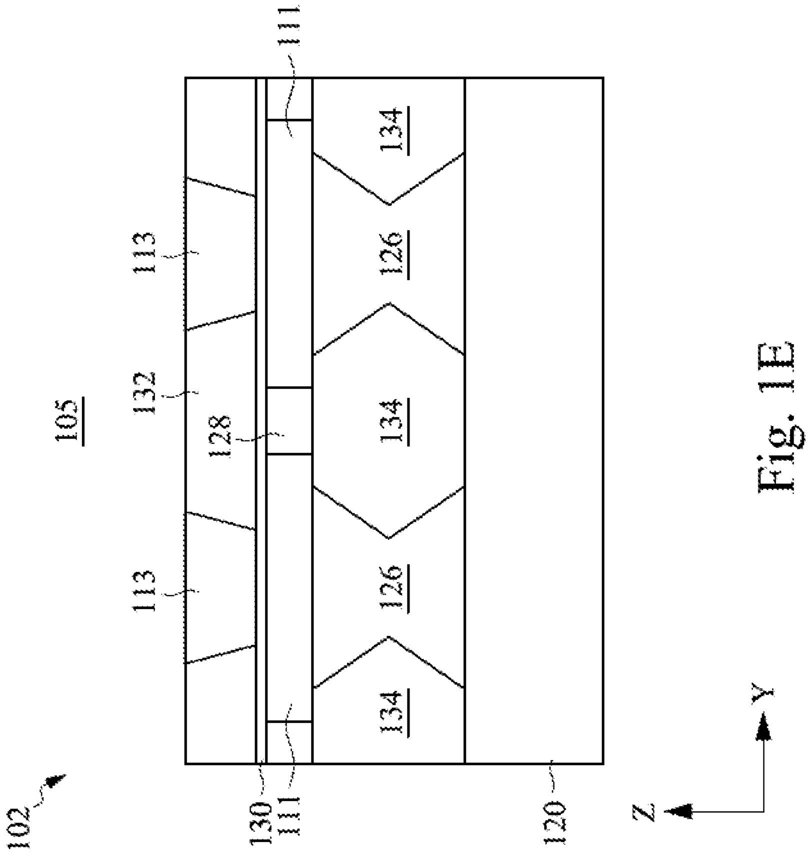
Figure 1D:
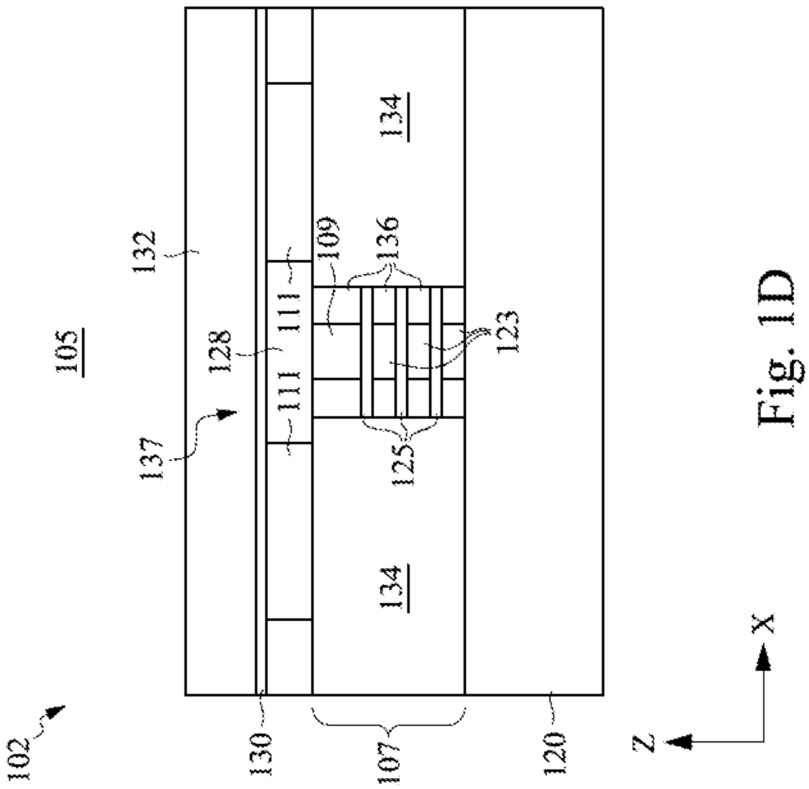

FIGS. 1D and 1E are cross-sectional views of the device region 105 of the integrated circuit 102, in accordance with some embodiments. The view of FIG. 1D is taken along cut lines DX in FIG. 1B. The view of FIG. 1E is taken along cut lines DY in FIG. 1B.

With reference to FIG. 1D, the semiconductor stack 107 has been processed to produce stacked channels 125 and source/drain regions 134 of a gate all around nanostructure transistor. The sacrificial semiconductor nanostructures 123 are positioned between the stacked channels 125. The channels 125 are the same material as the semiconductor layers 124. The sacrificial semiconductor nanostructures 123 are a same material as the semiconductor layers 122.

The channels 125 may correspond to semiconductor nanostructures and may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

The channels 125 may also be termed semiconductor nanosheets, though other types of semiconductor nanostructures can be utilized without departing from the scope of the present disclosure. The channels 125 can include a monocrystalline semiconductor material such as silicon, silicon germanium, or other semiconductor materials. The channels 125 may be an intrinsic semiconductor material or may be a doped semiconductor material. The semiconductor nanostructures may include nanosheets, nanowires, or other types of nanostructures. The channels 125 may have a thickness in the Z direction between 2 nm and 5 nm. The channels 125 may have a width in the X direction between 5 nm and 15 nm. Other materials and dimensions can be utilized for the channels 125 without departing from the scope of the present disclosure.

Inner spacers 136 have also been formed in recesses formed in the sacrificial semiconductor nanostructures 123. The inner spacers 136 can include silicon oxide, silicon nitride, SiCN, SiCON, SiCO, or other suitable dielectric materials. The inner spacers 136 electrically isolate the source/drain regions 134 from gate metals (not shown).

Although FIG. 1B illustrates the conductive structures 109 and the sacrificial semiconductor nanostructures 123 as being present, in practice, at the stage of processing shown in FIG. 1B the conductive structures 109 and the sacrificial semiconductor nanostructures 123 may already be replaced with one or more gate metals that wrap around the channels 125 and that fill the space left by the sacrificial semiconductor nanostructures and the conductive structures 109.

The source/drain regions 134 can be formed by etching the semiconductor fin 107 outside of the channels 125 and then performing an epitaxial growth to regrow the source/drain regions 134. The source/drain regions 134 can be doped with P type or N type dopants in situ during the epitaxial growth process.

The transistor 137 may include a gate dielectric (not shown) positioned between the channels 125 and the gate metal. The channels 125 extend in the X direction between the source/drain region 134.

Source/drain contacts 111 are positioned on the source/drain regions 134. The source/drain contacts 111 correspond to metal structures that are electrically and physically coupled to the source/drain regions 134. The source/drain contacts 111 are formed of a same material and in a same deposition process as the first metal structures 110. Though not shown in FIG. 1D, a layer of silicide may be positioned directly between the source/drain regions 134 and the source/drain contacts 111. FIG. 1D also illustrates the dielectric layers 128, 130, and 132 which are as described in relation to FIG. 1C.

The transistor 137 may generally operate in the following manner. A gate voltage may be applied to the gate metal (not shown) to render the channels 125 conducting or nonconducting. In the example of an N-channel transistor, a gate voltage of ground may turn off the transistor 137, while a gate voltage of VDD may turn on the transistor 137. In the example of a P-channel transistor, a gate voltage of ground may turn on the transistor 137 while a gate voltage of VDD may turn off the transistor 137. If the transistor 137 is turned on and there is a voltage difference between the source/drain regions 134, then a current may flow between the source/drain regions 134 through each of the channels 125. Voltages may be applied to the source/drain regions 134 via the portions of the source/drain contacts 111. The conductive vias 113 are not shown in the view of FIG. 1D.

FIG. 1E illustrates the dielectric layer 126 between the source/drain regions 134 in the Y direction. FIG. 1E also illustrates source/drain contacts 111 positioned on the inter-level dielectric layer 126. FIG. 1E the illustrates the conductive vias 113 extending through the dielectric layers 132 and 130 and connecting with contacting the source/drain contacts 111. As described previously, the conductive vias 113 may have a same material and may be formed in a same deposition process as the second metal structures 112.

As set forth previously, at the stage of processing shown in FIGS. 1A-1E, the integrated circuit 102 is now ready for a diffraction-based overlay measurement process utilizing the second metal structures 112 of the overlay mark region 104 as a diffraction grating. The presence of the first metal structures 110 below the second metal structures 112 helps ensure that the diffraction-based overlay measurement will effectively assist in the alignment process to form subsequent metal lines.

As described previously, some source/drain contacts may suffer cell stress. The root cause of this is too many potassium ions remaining in the source/drain area. A CMP slurry without potassium may be utilized to address this issue. However, this new CMP slurry may induce high topography issues as described previously. Accordingly, a shielding grating of first metal structures 110 of 40 nm width and a pattern density between 15% and 25% may be utilized. But this could introduce background noise in the overlay measurement processes. Accordingly, the grating of metal structures 112 is utilized laterally offset from the metal structures 110. This results in a 30% improvement in overlay measurement signal. The height of the structures 112 is increased by about 10 nm. This improves alignment accuracy from about 8 nm to 2 nm.

Figure 1F:
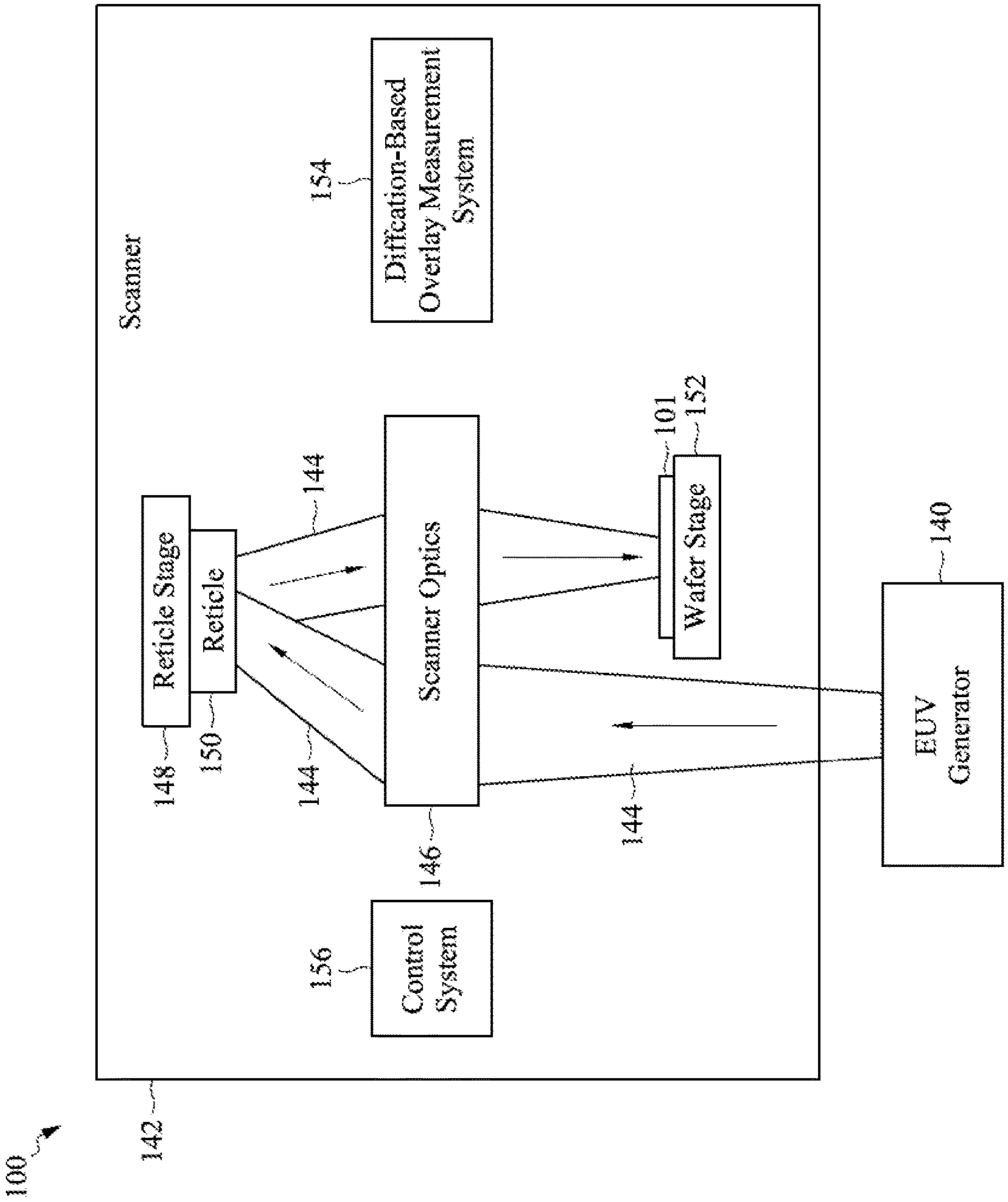
FIG. 1F is a block diagram of a photolithography system, in accordance with some embodiments.

FIG. 1F is a block diagram of an EUV photolithography system 100, in accordance with some embodiments. Description of the EUV photolithography system 100 assist in understanding of the overall photolithography process of which diffraction-based overlay measurement plays a part. Notably, the photolithography system 100 includes an EUV generator 140, a scanner 142, and a diffraction-based overlay measurement system 154 within the scanner 142. As used herein, the terms "EUV light" and "EUV radiation" can be used interchangeably. While description of the FIG. 1F may primarily focus on EUV photolithography, principles of the present disclosure extend to photolithography processes other than EUV photolithography processes.

The EUV generator 140 generates EUV light. The EUV generator may include a droplet generator, an EUV light generation chamber, a droplet receiver, a scanner 142, and a laser. The droplet generator outputs droplets into the EUV light generation chamber. The laser irradiates the droplets with pulses of laser light within the EUV light generation chamber. The irradiated droplets emit EUV light 144. The EUV light 144 is collected by a collector and reflected toward the scanner 142. The scanner 142 conditions the EUV light 144, reflects the EUV light 144 off of reticle 150 including a mask pattern, and focuses the EUV light 144 onto the wafer 101. The EUV light 144 patterns a layer on the wafer 101 in accordance with a pattern of the reticle 150. Each of these processes is described in more detail below. The wafer 101 includes a plurality of integrated circuits 102.

The scanner 142 includes scanner optics 146. The scanner optics 146 include a series of optical conditioning devices to direct the EUV light 144 to the reticle. The scanner optics 146 may include refractive optics such as a lens or a lens system having multiple lenses (zone plates). The scanner optics 146 may include reflective optics, such as a single mirror or a mirror system having multiple mirrors. The scanner optics 146 direct the ultraviolet light from the EUV light generation chamber to a reticle 150.

FIG. 1F illustrates a reticle 150 within the scanner 142. The reticle 150 is mounted on a reticle stage 148. The reticle stage can translate in the X, Y, and Z directions in order to properly aligned with the wafer 101.

During an EUV exposure process, EUV light 144 reflects off of the reticle 150 back toward further optical features of the scanner optics 146. In some embodiments, the scanner optics 146 include a projection optics box. The projection optics box may have refractive optics, reflective optics, or combination of refractive and reflective optics. The projection optics box directs the EUV light 144 onto the wafer 101, for example, a semiconductor wafer.

The EUV light 144 includes a pattern from the reticle 150. In particular, the reticle 150 includes the pattern to be defined in the wafer 101. After the EUV light 144 reflects off of the reticle 150, the EUV light 144 contains the pattern of the reticle 150. A layer of photoresist typically covers the wafer 101 during extreme ultraviolet photolithography irradiation. The photoresist assists in patterning a surface of the semiconductor wafer 101 in accordance with the pattern of the reticle.

A wafer stage 152 may hold the wafer 101 during photolithography processes. The wafer stage can translate in the X, Y, and Z directions. This can assist in aligning the wafer 101 and the reticle 150.

The diffraction-based overlay measurement system 154 performs diffraction-based overlay measurements to assist in aligning the wafer 101 and the reticle 150. The wafer 101 may include a large number of integrated circuits 102. Each exposure may pattern a single integrated circuit of the wafer 101. Accordingly, the diffraction-based overlay measurement system 154 may perform diffraction-based overlay measurements for each integrated circuit of the wafer 101. The diffraction-based overlay measurement system 154 irradiates the wafer 101 with selected wavelengths of light, for example, between 400 nm and 850 nm. More particularly, the diffraction-based overlay measurement system 154 irradiates the overlay mark region 104 of the integrated circuit 102 for which alignment is being performed. The grating of second metal structures 112 acts as a diffraction grating and diffracts the light from the diffraction-based overlay measurement system 154. The diffraction-based overlay measurement system 154 senses the diffracted light and calculates alignment or misalignment based on the diffracted light.

The scanner 142 may include a control system 156 that controls the components of the system 100. The control system 156 may be coupled to the diffraction-based overlay measurement system 154 and may adjust the positions of the wafer 101 and the reticle 150 based, at least in part, on the diffraction-based overlay measurement system 154.

Figure 1H:
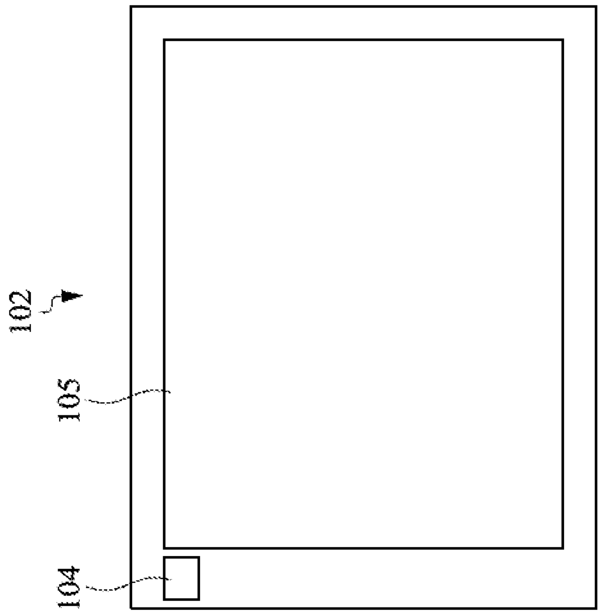
FIG. 1H is a simplified top view of an integrated circuit, in accordance with some embodiments.
Figure 1G:
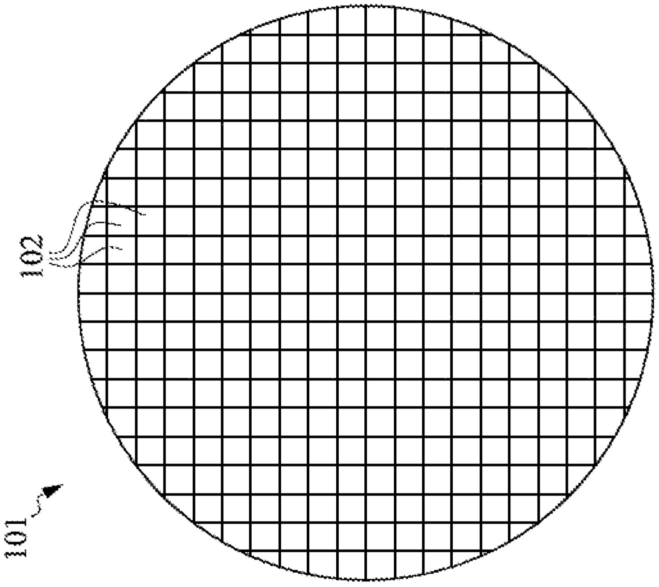
FIG. 1G is a top view of a wafer, in accordance with some embodiments.

FIG. 1G is a top view of a wafer 101, in accordance with some embodiments. The wafer 101 can correspond to a semiconductor wafer including a plurality of identical integrated circuits 102. During patterning, each integrated circuit 102 may be individually exposed to EUV light via the reticle 150.

FIG. 1H illustrates a simplified top view of an integrated circuit 102 of the wafer 101, in accordance with some embodiments. The integrated circuit 102 includes an overlay mark region 104 and a device region 105. The overlay mark region 104 includes the structures shown and described in relation to FIGS. 1A-1E. Although a single overlay mark region 104 is illustrated in FIG. 1H, in practice and integrated circuit 102 may include multiple overlay mark regions 104. The device region 105 may include features and structures shown and described in relation to FIGS. 1A-1E, as well as other types of features and structures not shown.

FIGS. 2A-9C cross-sectional views of an integrated circuit 102 at intermediate stages of processing, in accordance with one embodiment. FIGS. 2A-8C illustrates a process for forming the integrated circuit 102 of FIGS. 1A-1E, in accordance with some embodiments. In FIGS. 2A-9C, Figures with suffix "A" are taken along a cut line corresponding to the cut line OY from FIG. 1A and correspond to the overlay mark region 104. In FIGS. 2A-9C, Figures with suffix "B" are taken along DY of FIG. 1B and correspond to the device region 105. In FIGS. 2A-9C, Figures with suffix "C" are taken along DX of FIG. 1C and correspond to the device region 105.

Figure 2A:
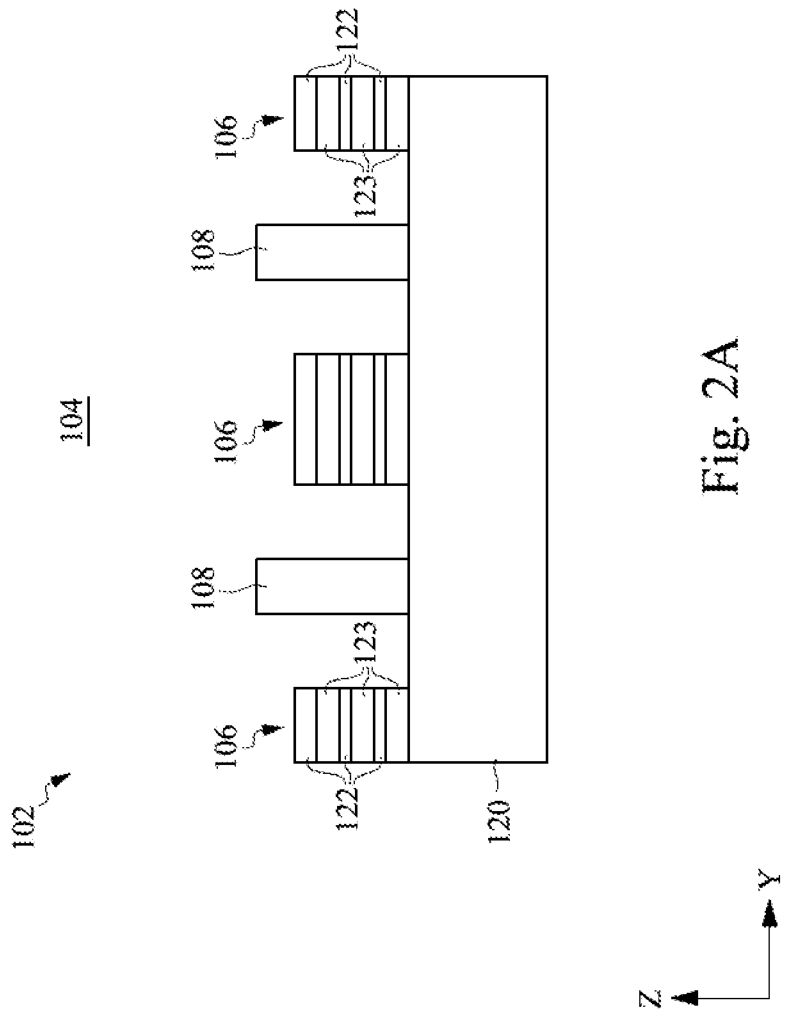
FIGS. 2A-10 are cross-sectional views of an overlay mark region and the device region of an integrated circuit at various stages of processing, in accordance with some embodiments.

In FIG. 2A, the semiconductor fins 106 and the conductive structures 108 have been formed and patterned on the substrate 120 in the overlay mark region 104. The semiconductor fins 106 and the conductive structures 108 can have the materials and structures described previously.

Figure 2C:
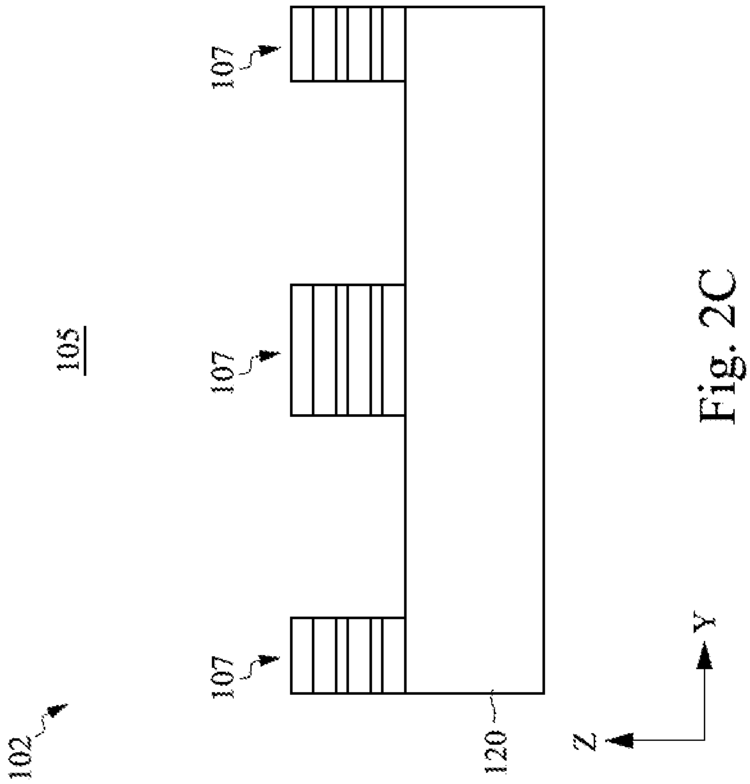
Figure 2B:
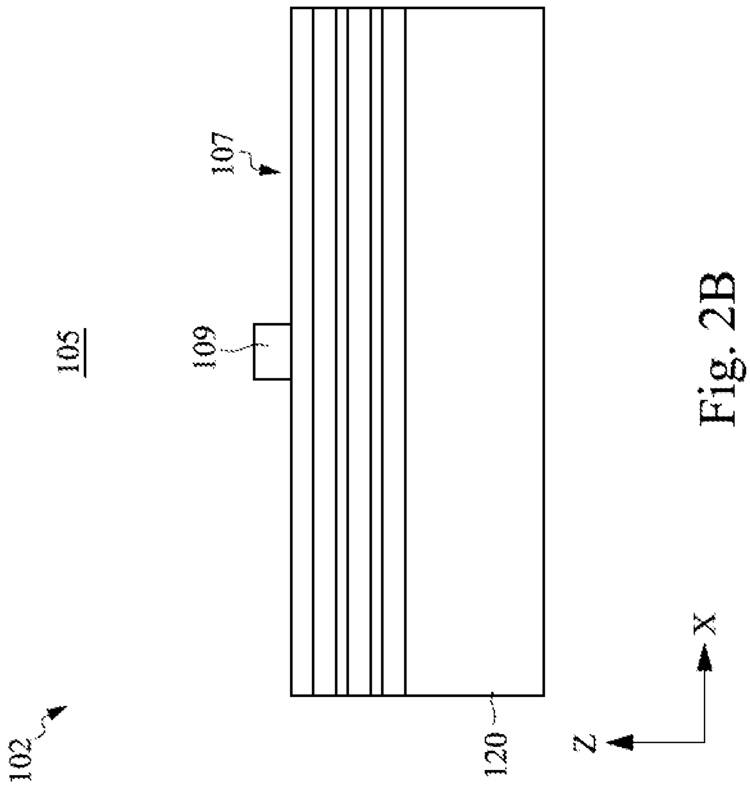

In FIGS. 2B and 2C, the semiconductor fins 107 and the conductive structure 109 have been formed and partially patterned. However, FIG. 2B illustrates that the semiconductor fin 107 has not yet been etched to make space for the source/drain regions 134 to be epitaxially grown.

Figure 3A:
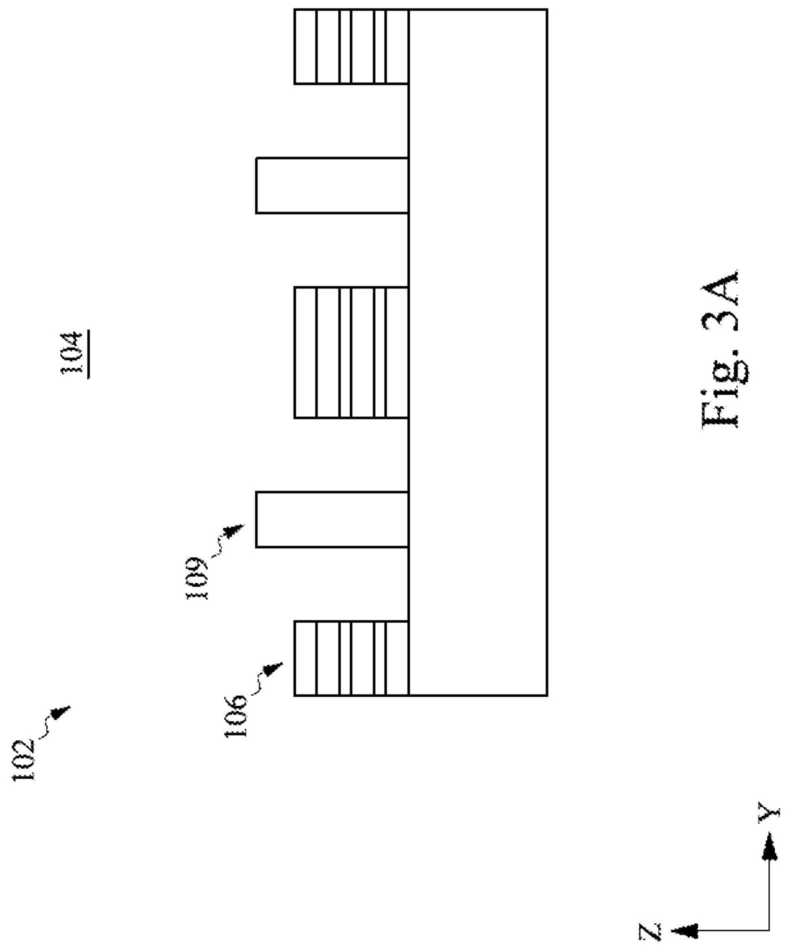
Figure 3C:
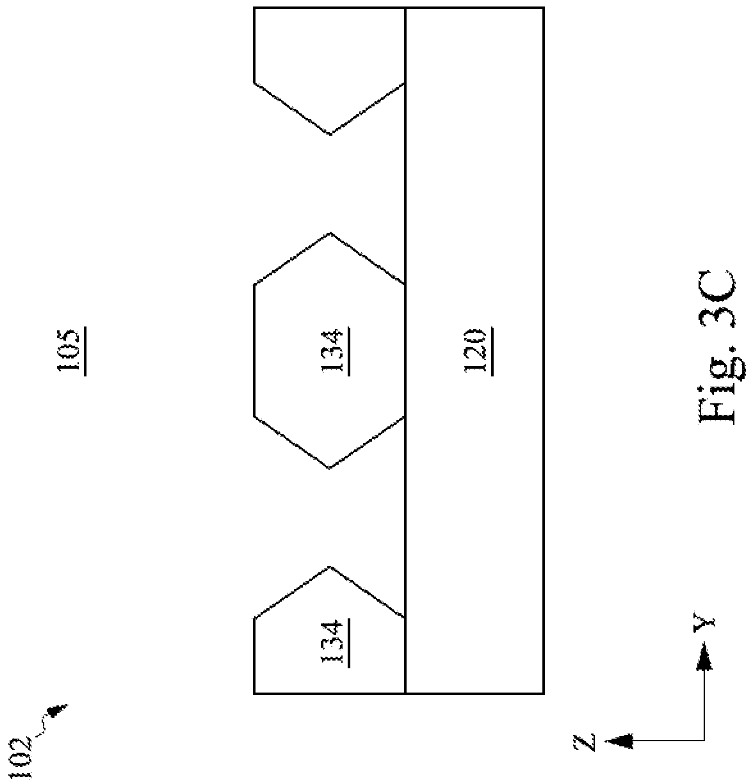
Figure 3B:
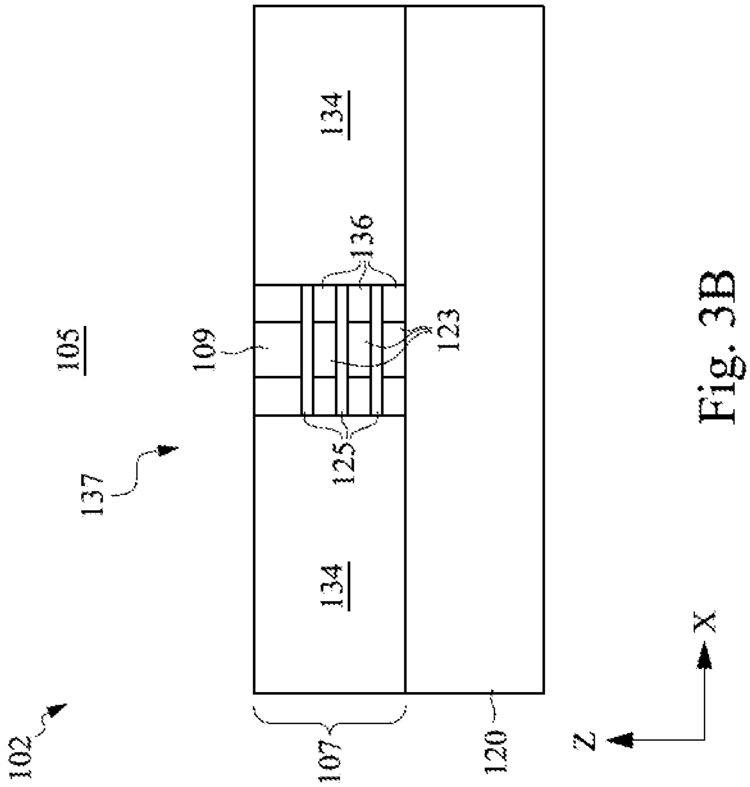

In FIG. 3B, the semiconductor fin 107 has been processed to form a transistor 137. This can be accomplished by first masking and etching the semiconductor fin 107 to remove material and make place for the source/drain regions 134. After this, the sacrificial semiconductor nanostructures 123 can be recessed via one or more etching processes. The inner spacers 136 can then be formed in the recesses between the channels 125. The inner spacers 136 can be deposited by ALD, CVD, PVD, or by other suitable deposition processes.

The source/drain regions 134 can then be grown via an epitaxial growth process from the exposed portions of the channels 125 or from the substrate 120. The source/drain regions 134 can be doped in situ with N type or P type dopants, according to the desired type of the transistor 137.

Though not shown in FIG. 3B, the conductive structures 109 and the sacrificial semiconductor nanostructures 123 can be entirely removed. After removal of the conductive structures and the sacrificial semiconductor nanostructures 123, a gate dielectric can be deposited on the exposed surfaces of the channels 125. The gate dielectric can include a low K interfacial gate dielectric in contact with the channels 125 and a high K gate dielectric in contact with the interfacial gate dielectric. One or more gate metals can then be deposited in place of the sacrificial semiconductor nanostructures 123 and the conductive structures 109. FIG. 3C illustrates the empty gaps between adjacent source/drain regions 134 in the Y direction. The overlay mark region 104 of FIG. 3A is substantially identical to that shown in FIG. 2A.

Figure 4A:
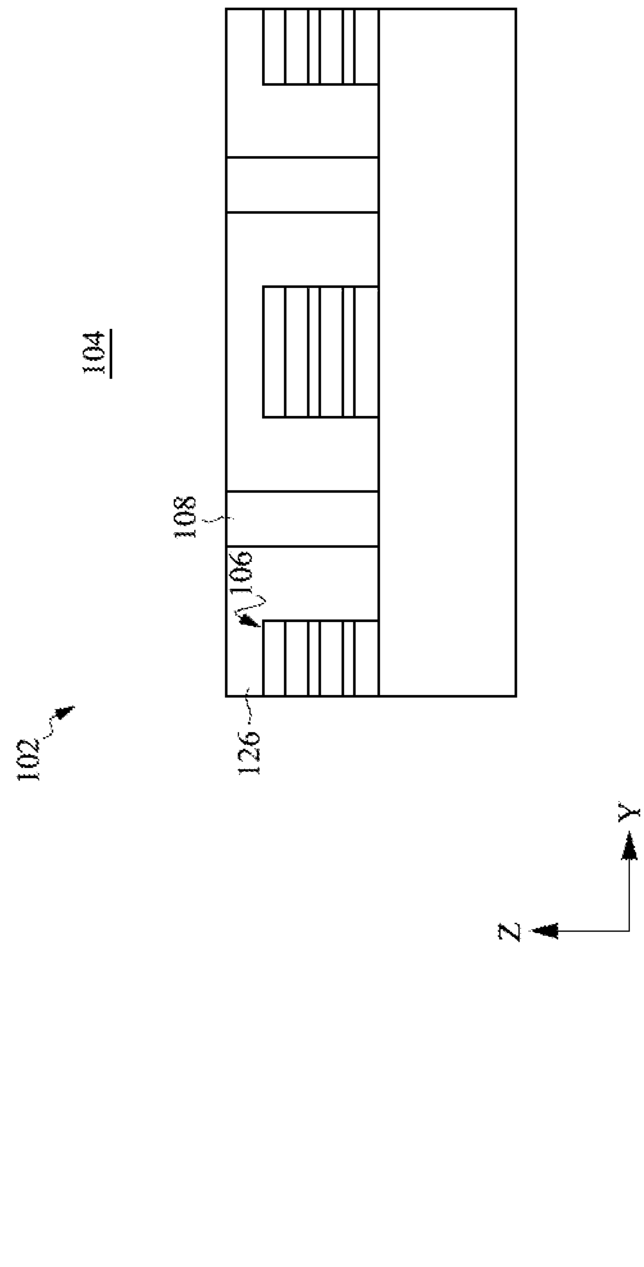
Figure 4C:
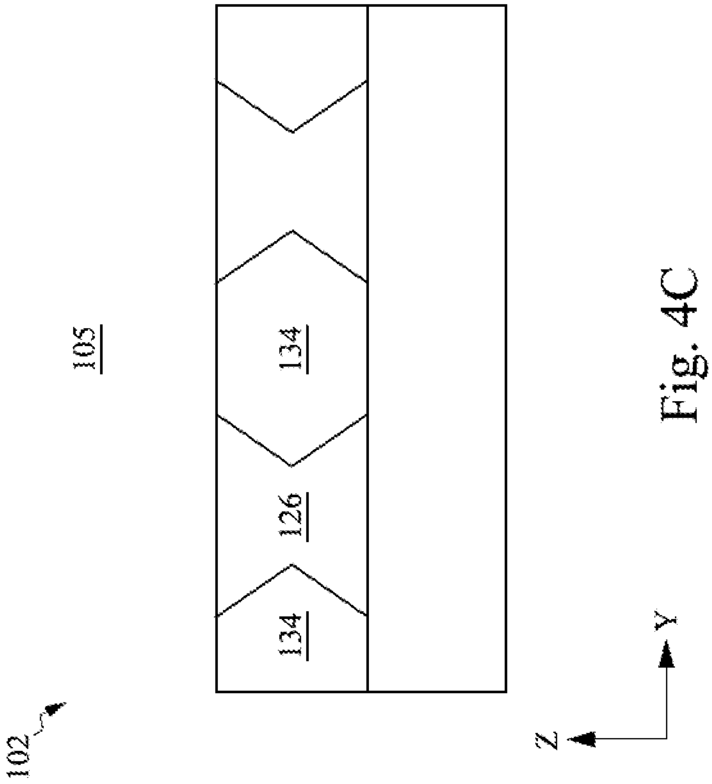
Figure 4B:
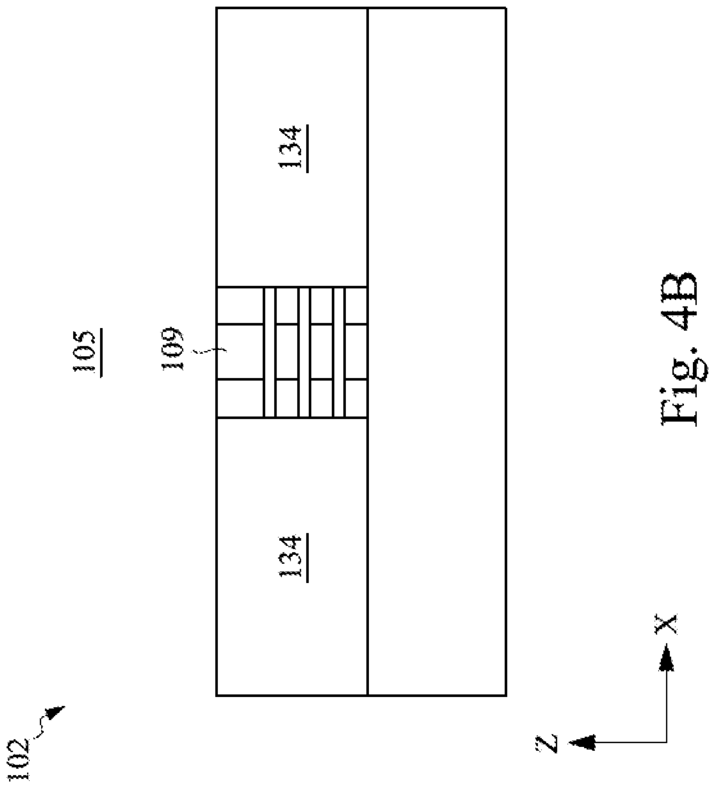

In FIGS. 4A-4C, an interlevel dielectric layer 126 has been deposited. The interlevel dielectric layer 126 can include the materials described previously and can be deposited by ALD, CVD, PVD, or any other suitable deposition process. A CMP process may be performed so that the top surface of the interlevel dielectric layer 126 is substantially even with the top surface of the conductive structure 108 of the overlay mark region 104 and with the top surface of the source/drain regions 134 of the device region 105.

Figure 5A:
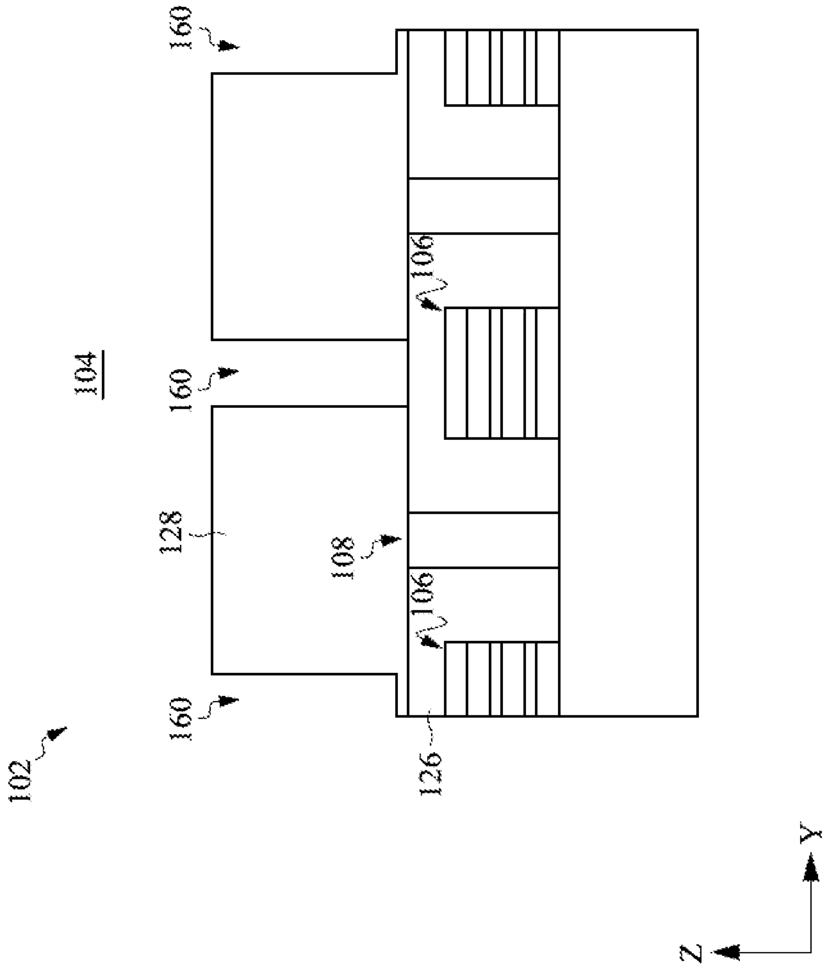
Figure 5C:
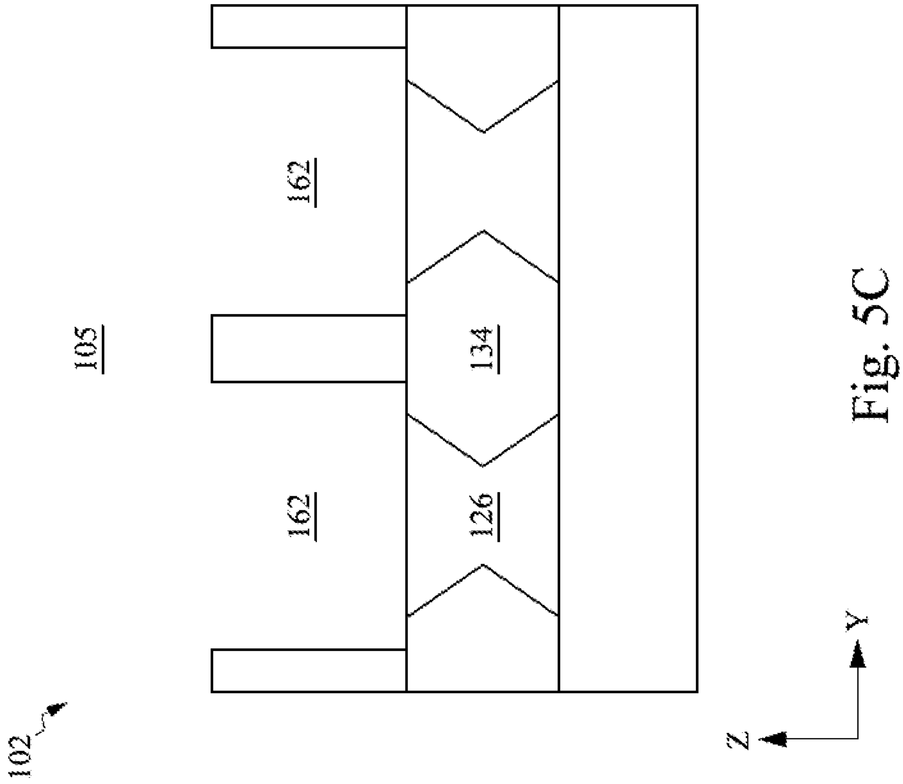
Figure 5B:
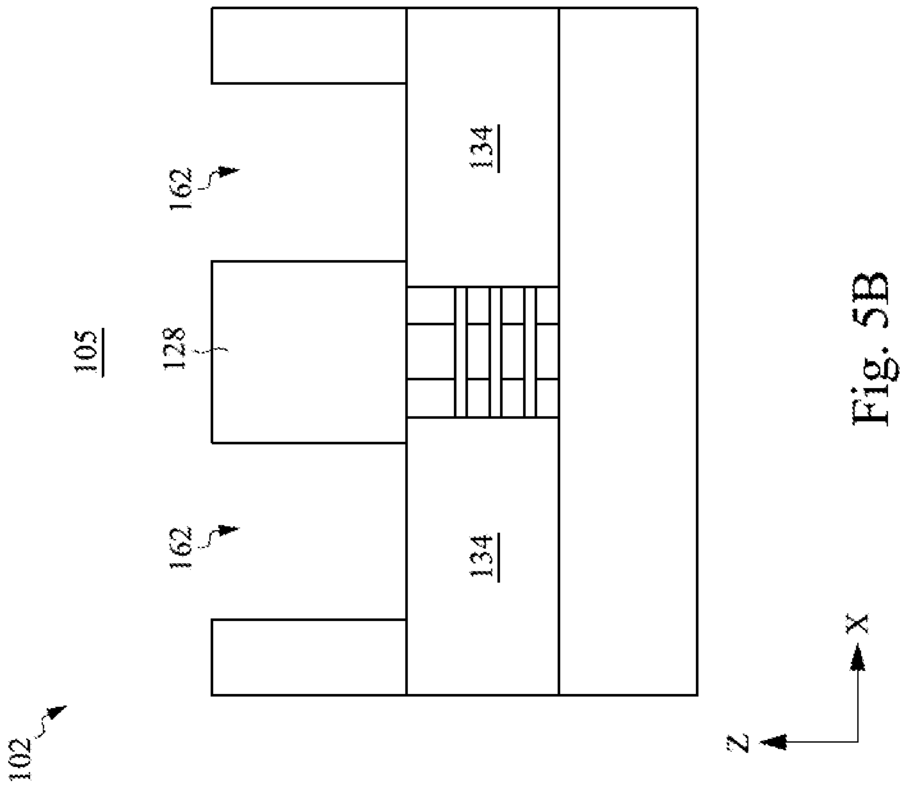

In FIGS. 5A-C, an interlevel dielectric layer 128 has been deposited on the interlevel dielectric layer 126, in accordance with some embodiments. The interlevel dielectric layer 128 can have materials as described previously and can be deposited by ALD, CVD, PVD, or any other suitable deposition process. After deposition of the interlevel dielectric layer 128, a photolithography process is performed to form trenches 160 in the overlay mark region 104 and trenches 162 in the device region 105. The trenches 160 are positioned directly over the semiconductor fins 106 in the overlay mark region 104. The trenches 162 expose portions of the source/drain regions 134 and interlevel dielectric layer 126 in the device regions 105.

Figure 6A:
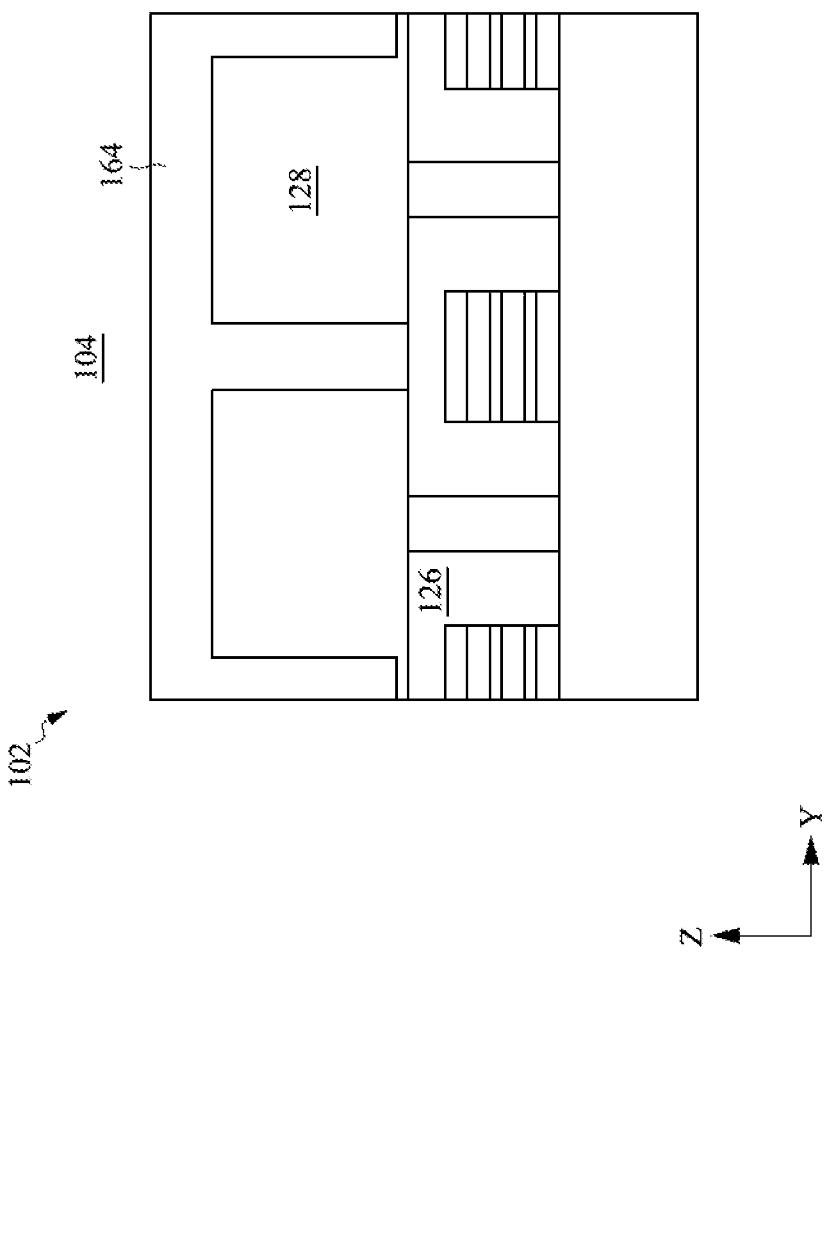
Figure 6C:
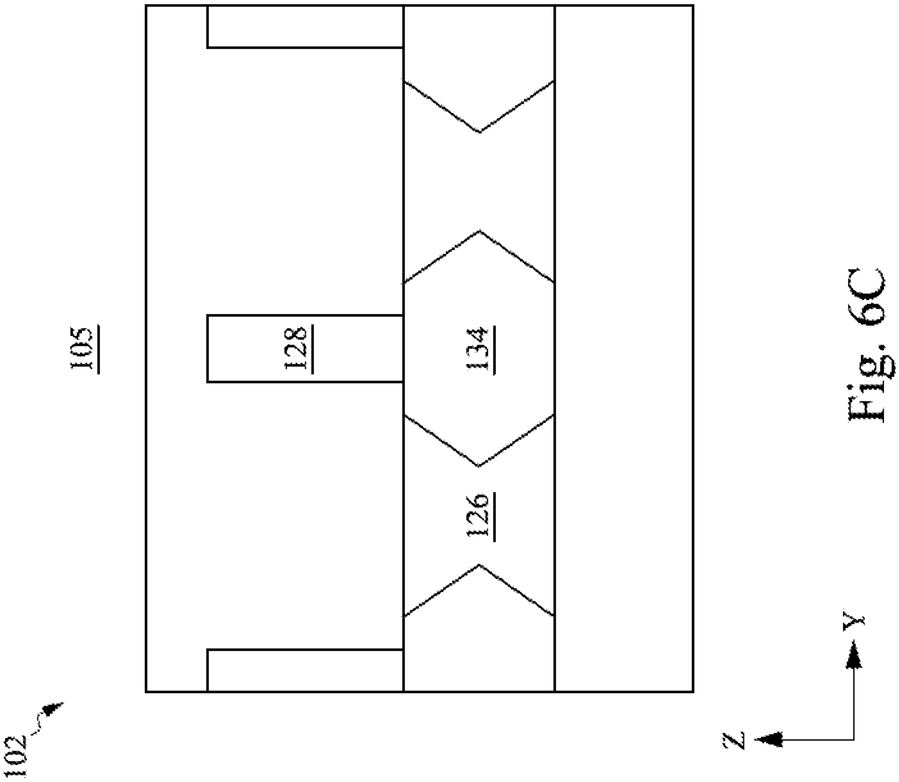
Figure 6B:
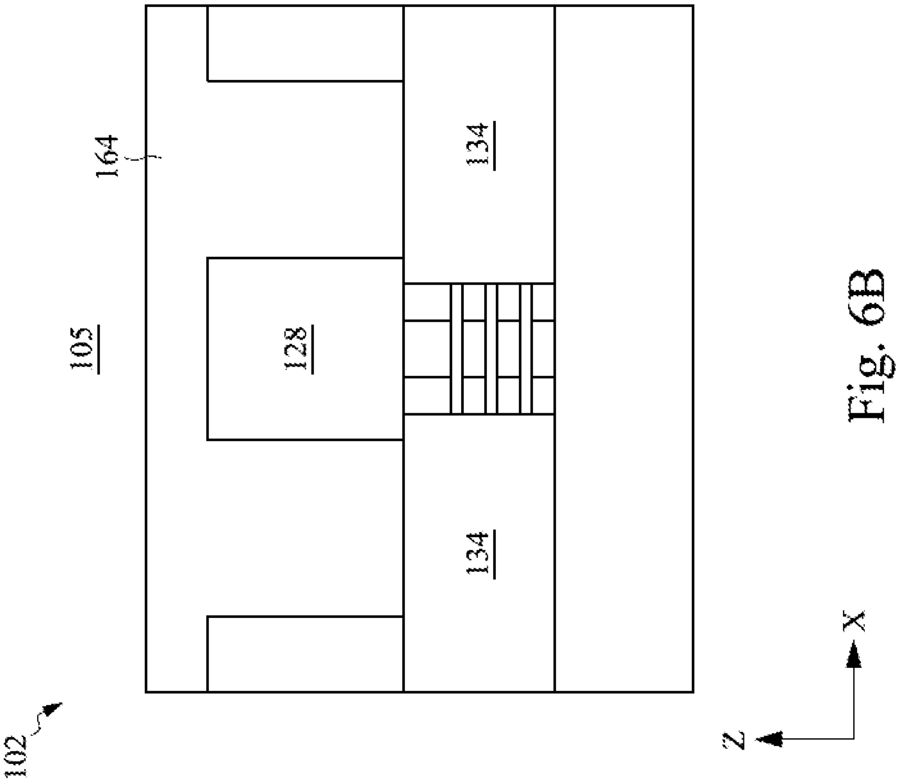

In FIGS. 6A-6C, a metal layer 164 has been deposited on the interlevel dielectric layer 128 at the overlay mark region 104 and the device region 105, in accordance with some embodiments. The metal layer 164 corresponds to the metal layer from which the source/drain contact 111 will be formed and from which the grating of first metal structures 110 will be formed. Accordingly, the metal layer 164 can have the materials described previously in relation to the structures. The metal layer 164 can be deposited by PVD, ALD, CVD, or other suitable dielectric structures. The metal layer 164 fills the trenches 160 and 162 and is in contact with the source/drain regions 134 and the interlevel dielectric layer 126. As described previously, prior to deposition of the metal layer 164, a silicide layer may be formed on the top surface of the source/drain regions 134.

Figure 7A:
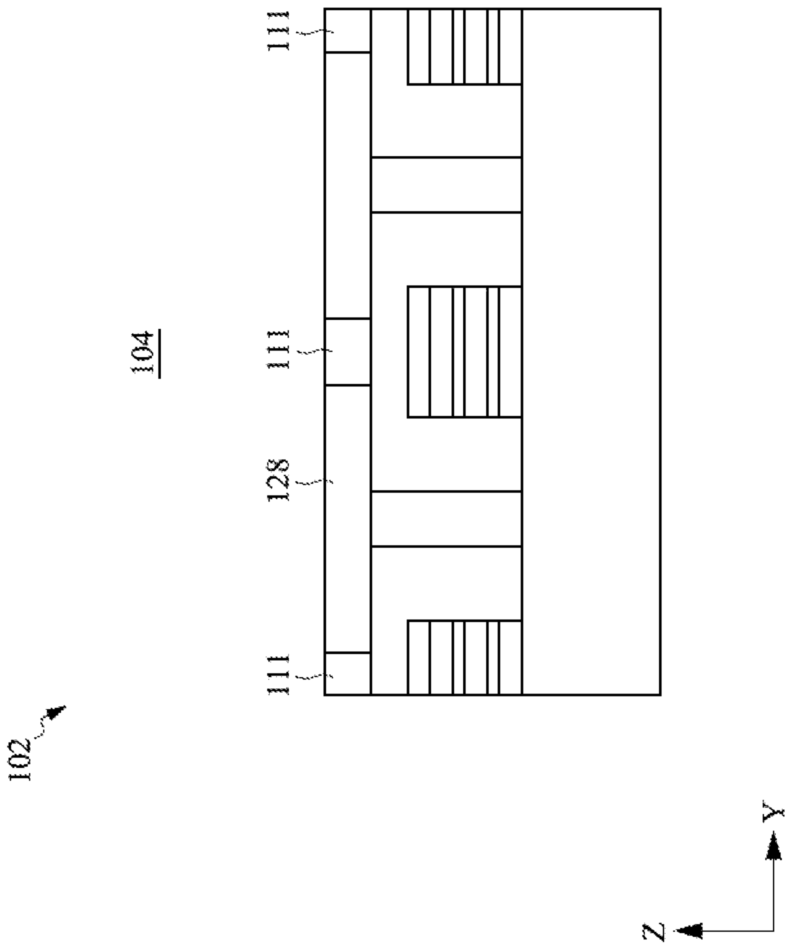
Figure 7C:
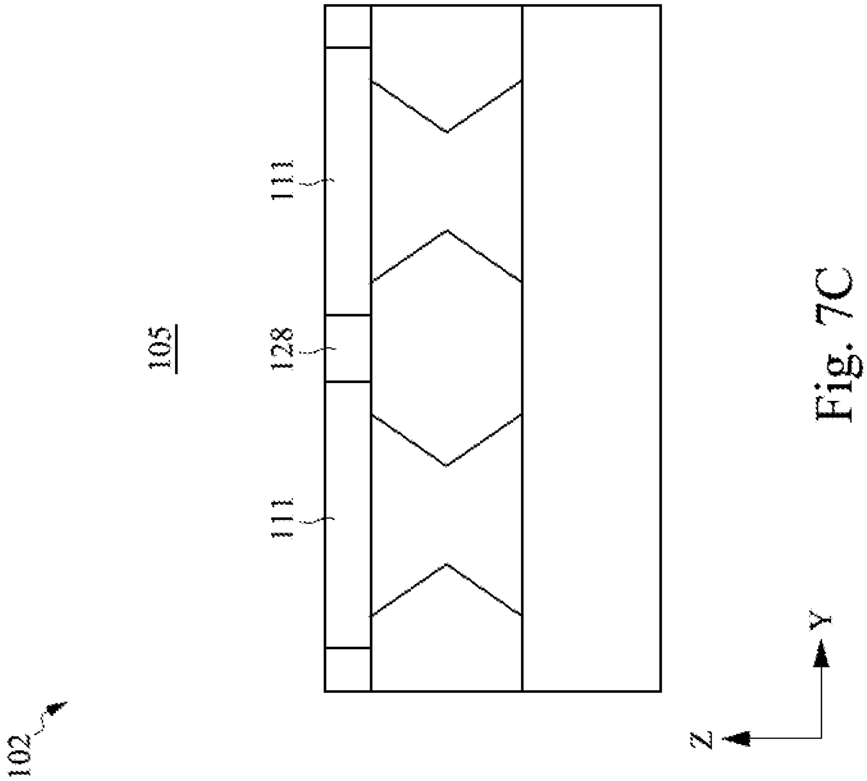
Figure 7B:
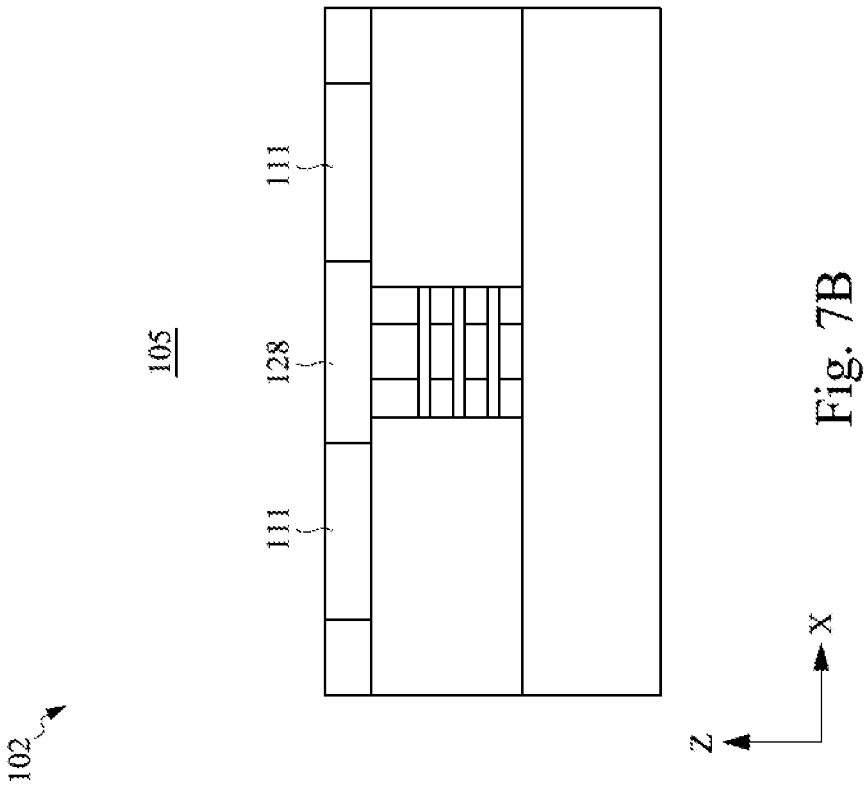

In FIGS. 7A-7C, a CMP process has been performed to reduce the heights and planarize the top surfaces of the first metal structures 110 and the source/drain contacts 111 with the interlevel dielectric layer 128.

Figure 8A:
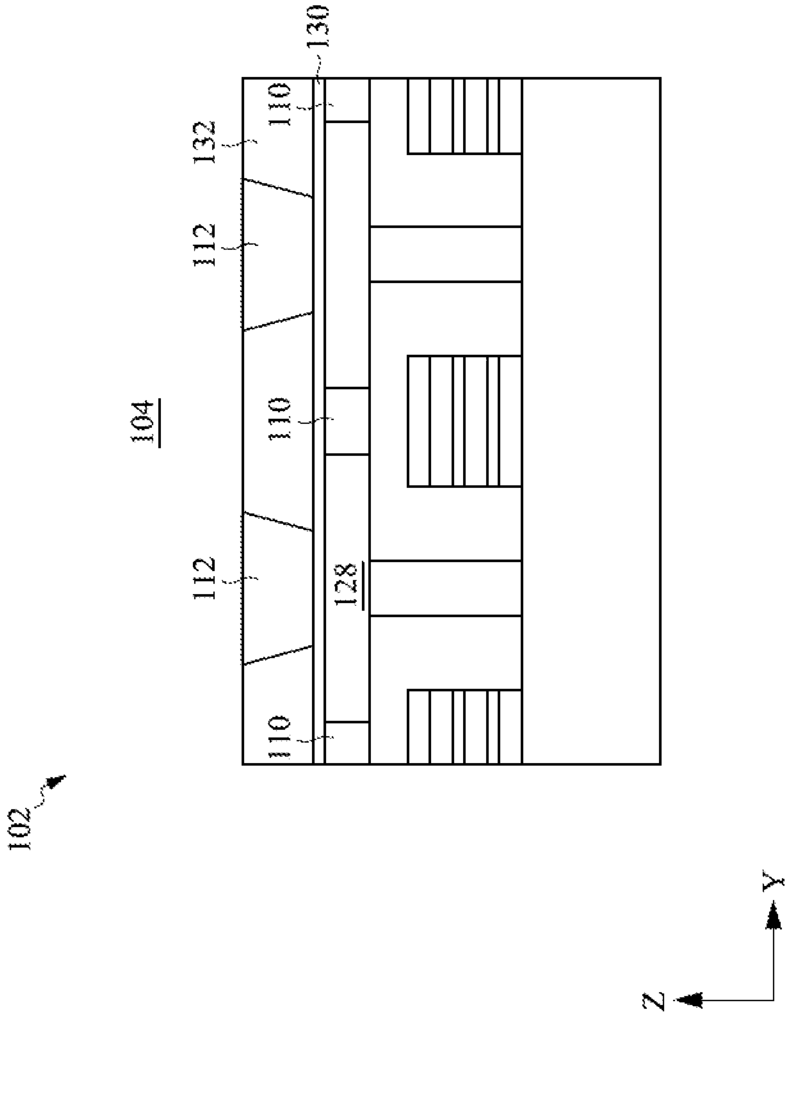
Figure 8C:
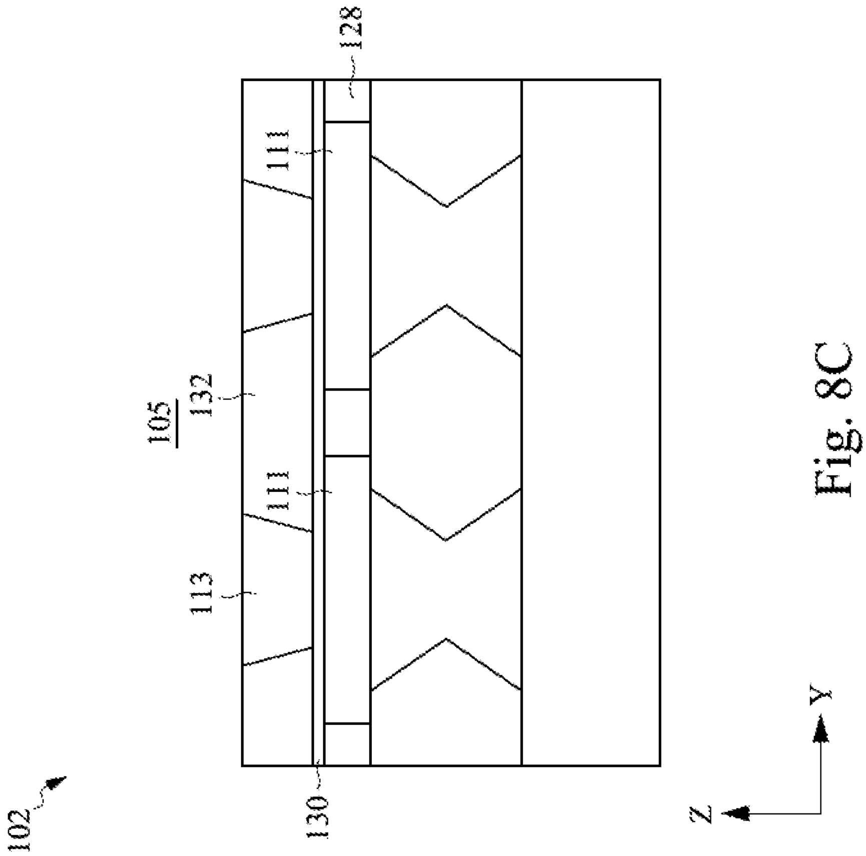
Figure 8B:
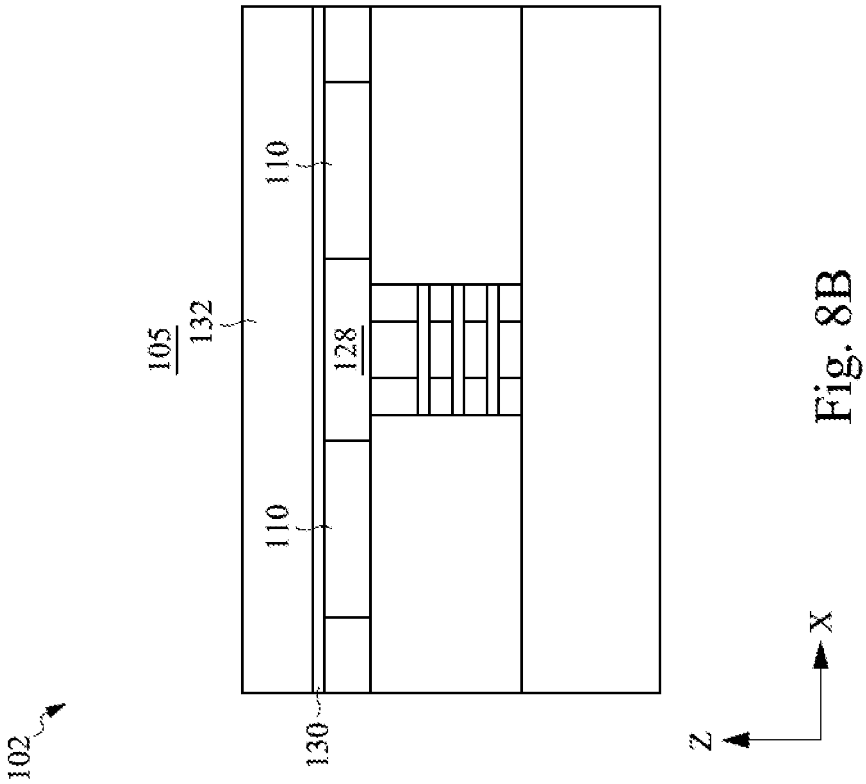

In FIGS. 8A-8C, the dielectric layer 130 and the interlevel dielectric layer 132 have been deposited, in accordance with some embodiments. The dielectric layer 130 and the interlevel dielectric layer 132 can have the materials described previously. The dielectric layer 130 and the interlevel dielectric layer 132 can be deposited by CVD, ALD, PVD, or other suitable deposition processes.

After deposition of the interlevel dielectric layer 132, trenches can be opened in the overlay mark region 104 exposing the dielectric layer 130. Trenches can also be opened in the device region 105 exposing selected portions of the source/drain contacts 111. The trenches can be opened via a photolithography process.

After formation of the trenches, a metal layer can be deposited in the trenches and on the top surfaces of the interlevel dielectric layer 132. The metal layer is the metal from which the grating of second metal structures 112 and the conductive vias 113 are formed. The metal layer can have materials described previously. The metal layer can be deposited by PVD, ALD, CVD, or by other suitable processes.

After deposition of the metal layer, a CMP process can be performed to remove excess metal from the top surface of the interlevel dielectric layer 132 and to planarize the services of the metal structures 112 and the conductive vias 113 with the top surface of the interlevel dielectric layer 132. As described previously, the CMP process may be a special CMP process in which a slurry is used that does not include potassium. As described previously, if the metal structures 110 are not present when the CMP process is performed, then the second metal structures 112 may be greatly reduced in height to the extent that a subsequent diffraction-based overlay measurement process cannot be performed properly. This can result in misalignment of subsequently formed metal lines.

Beneficially, the grating of first metal structures 110 is present below and offset from the grating of second metal structures at the overlay mark region 104. The result is that when the CMP process is performed, the height of the second metal structures 112 is not unduly reduced. Instead, the height of the second metal structures 112 is sufficient to enable a proper diffraction-based overlay measurement process after the CMP process. The stage of processing shown in FIGS. 8A-8C corresponds to the stage of processing shown in FIGS. 1A-1E.

Figure 9A:
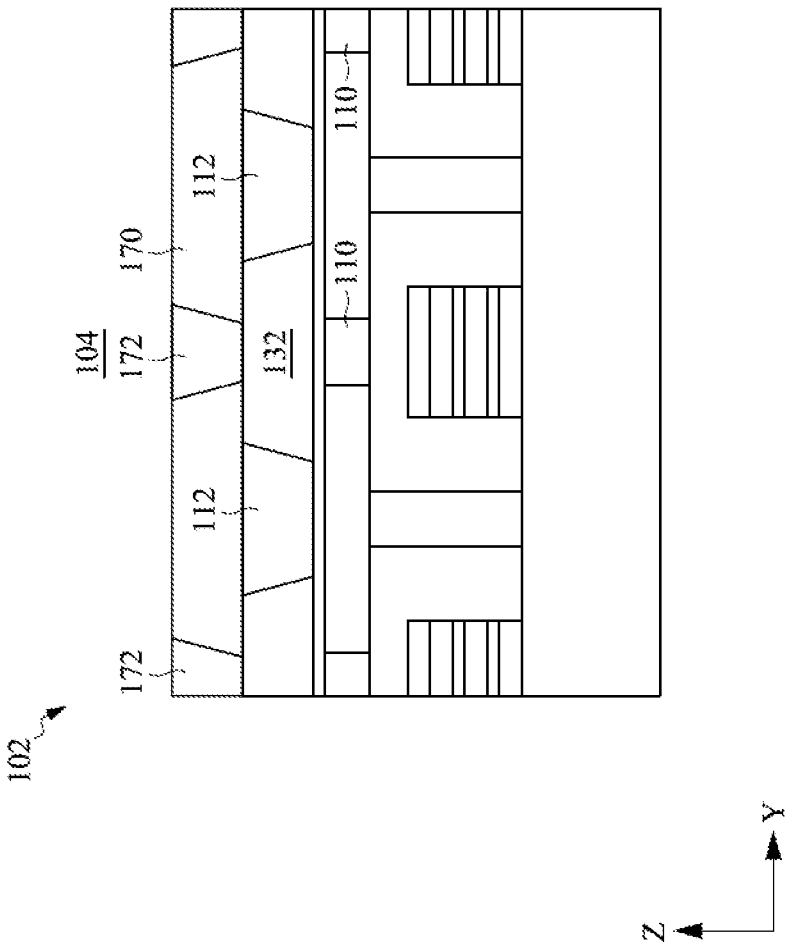
Figure 9C:
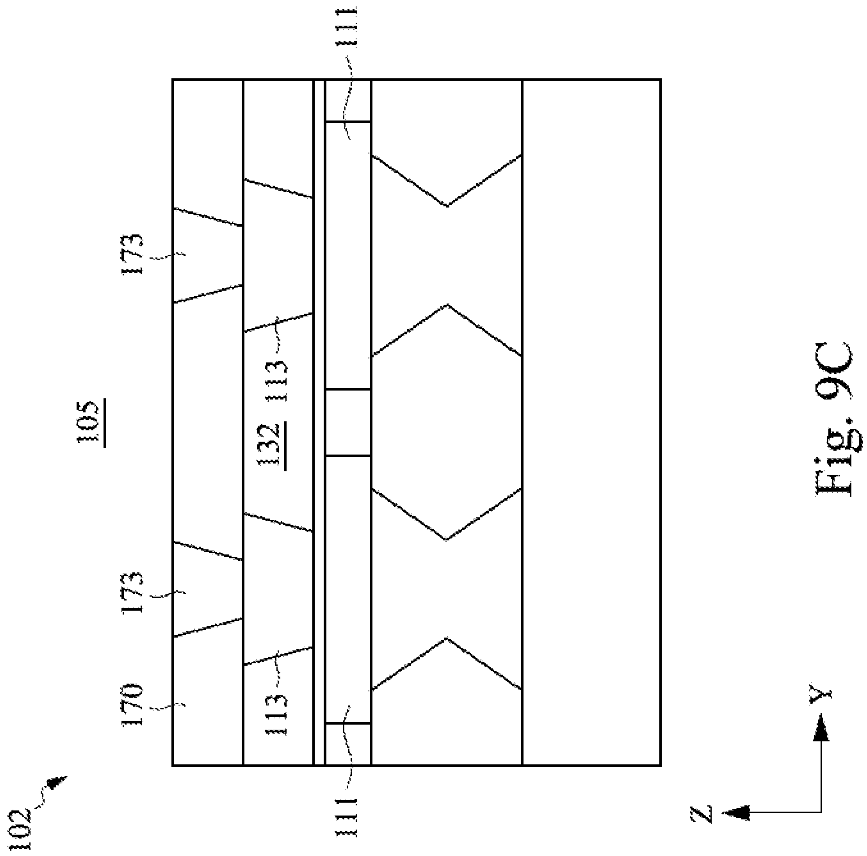
Figure 9B:
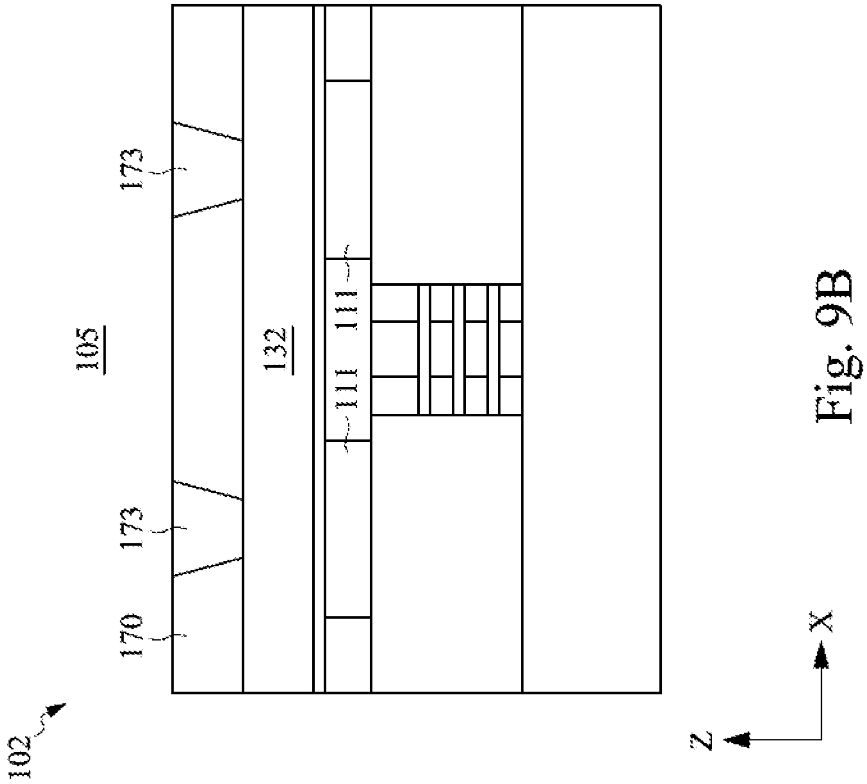

In FIGS. 9A-9C, an interlevel dielectric layer 170 has been deposited on the interlevel dielectric layer 132 and on the metal structures 112 and the source/drain contacts 111. The interlevel dielectric layer 170 can include silicon oxide, silicon nitride, SiC, SiCN, SiCO, SiCON, or other suitable dielectric materials. The interlevel dielectric layer 170 can be formed by CVD, ALD, PVD, or other suitable deposition processes.

After deposition of the interlevel dielectric layer 170 the diffraction-based overlay measurement process may be performed to ensure proper alignment for the subsequent patterning of the dielectric layer 170. The diffraction-based overlay measurement process utilizes the grating of second metal structures 112 as a diffraction grating. After alignment, a photolithography process is performed in trenches are opened in the dielectric layer 170. In the overlay mark region 104, trenches are open laterally between the metal structures 112. In the device region 105, the trenches are opened exposing the conductive vias 113. Because of the successful diffraction-based overlay measurement process as described previously, the trenches are aligned satisfactorily with the conductive vias 113.

After trenches have been opened in the dielectric layer 170, a metal layer is deposited in the trenches and on the top surfaces of the dielectric layer 170. The metal layer is in direct contact with the conductive vias 113 due to the proper alignment. A CMP process is then performed to remove excess metal material from the top surface of the dielectric layer 170 and to planarize the top surfaces of the metal layer and the interlevel dielectric layer 170. The result is that a grating of metal structures 172 has been formed at the overlay mark region 104 laterally offset from the second metal structures 112 and vertically aligned with the first metal structures 110. Metal lines 173 have been formed at the device regions 105. The metal lines 173 correspond to metal zero (M0). The metal lines 173 or metal interconnect structures. Though not shown, several more interlevel dielectric layers and layers of conductive vias and metal interconnects may subsequently be formed above the metal interconnects 173.

Figure 10:
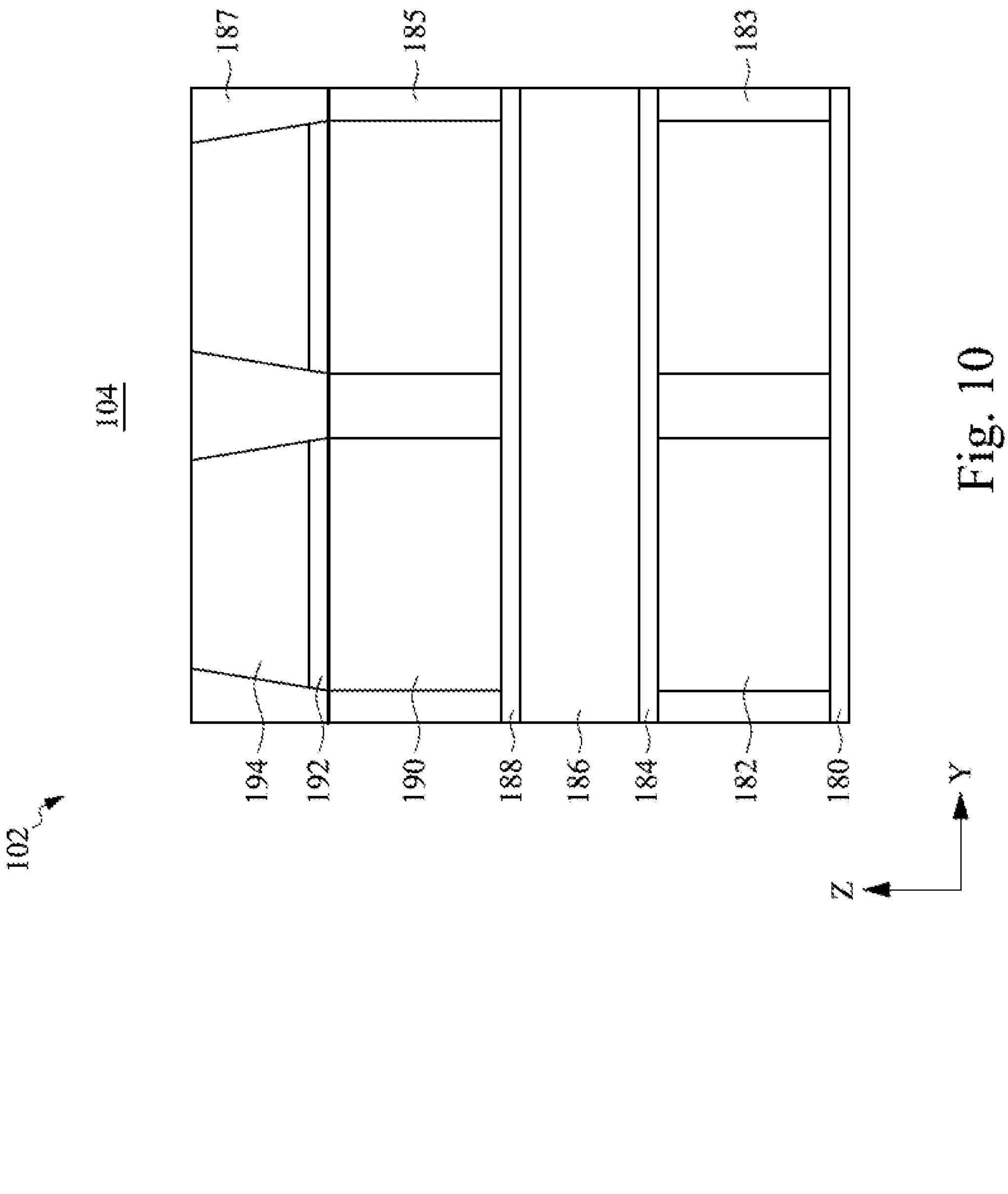

FIG. 10 is a cross-sectional view of an overlay mark region 104 of an integrated circuit 102, in accordance with some embodiments. The structure shown in FIG. 10 may be formed above the structure shown in FIGS. 9A-9C. In FIG. 10, a plurality of dielectric layers 180, 184, 188, 192 an interlevel dielectric layers 182, 186, 190, and 194 have been formed. The dielectric layers 180, 184, 188, and 192 may have the same materials and deposition processes as the dielectric layer 130. The interlevel dielectric layers 182, 186, 190, and 194 may have the same materials and deposition processes as the interlevel dielectric layer 170 described previously.

Metal structures 183 corresponds to metal one (M1) and can be utilized for shielding grating and CMP topography improvement as described previously. Though not shown, one or more conductive vias may be formed in the interlevel dielectric layer 186. Metal structures 185 may correspond to metal to (M2) and may also be utilized for shielding grating to improve CMP topography as described previously. Conductive vias 187 may be formed in the interlevel dielectric layer 194. Each of these gratings may be utilized during subsequent diffraction-based overlay measurement processes. Corresponding metal interconnects may be formed in the device region 105 of the integrated circuit 102. Furthermore, such overlay mark designs can be used to design knobs for source/drain contact CMP topography issues.

Figure 11:
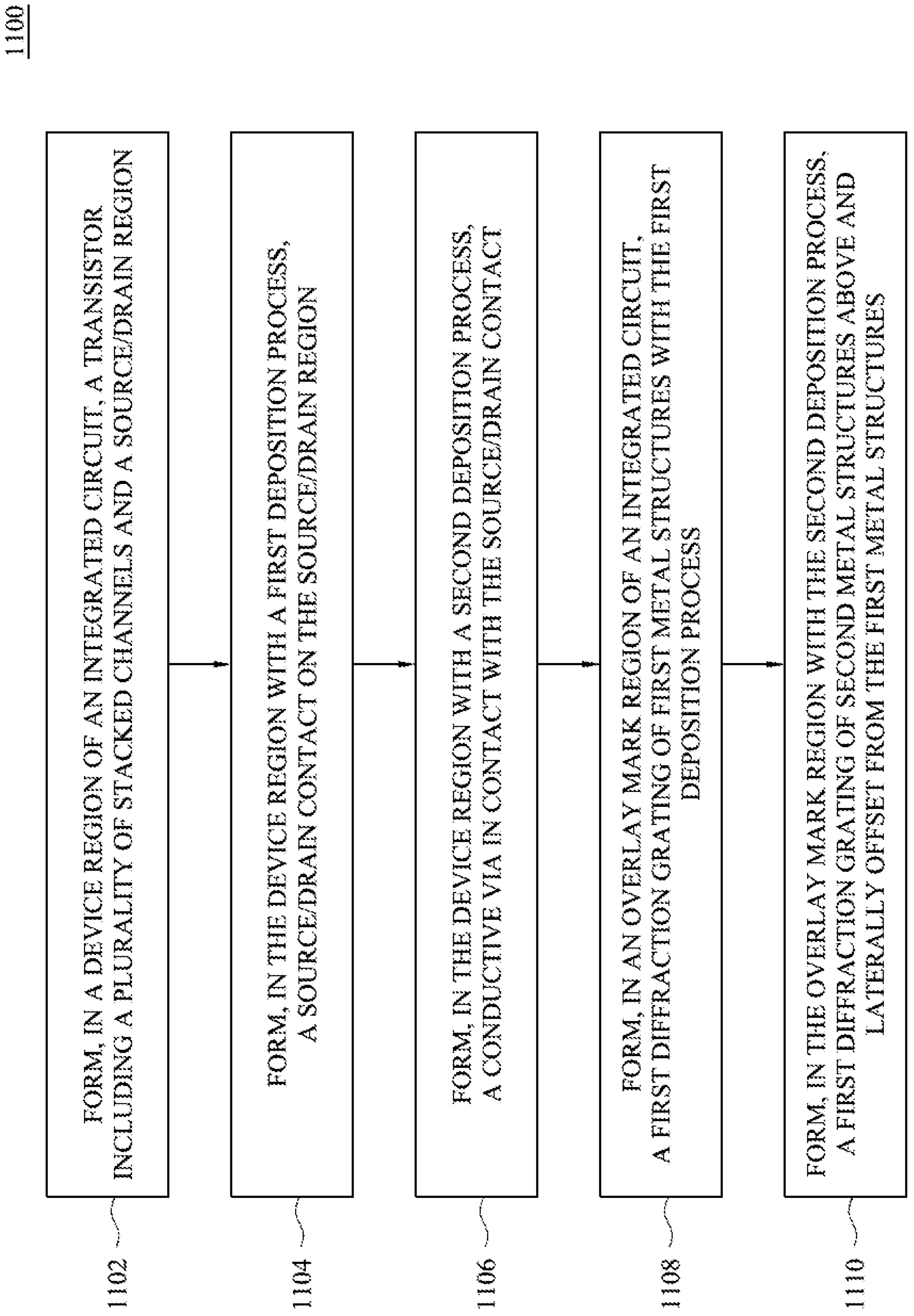
FIG. 11 is a flow diagram of a method for forming an integrated circuit, in accordance with some embodiments.

FIG. 11 is a flow diagram of a method 1100, in accordance with some embodiments. The method 1100 can utilize components, processes, and systems described in relation to FIGS. 1A-10. At 1102, the method 1100 includes forming, in a device region of an integrated circuit, a transistor including a plurality of stacked channels and a source/drain region. One example of a device region is the device region 105 of FIG. 1B. One example of a transistor is the transistor 137 of FIG. 1D. One example of stacked channels is the stacked channels 125 of FIG. 1D. One example of a source/drain region is the source/drain region 134 of FIG. 1D. At 1104, the method 1100 includes forming, in the device region with a first deposition process, a source/drain contact on the source/drain region. One example of a source/drain contact is the source/drain contact 111 of FIG. 1D. At 1106, the method 1100 includes forming, in the device region with a second deposition process, a conductive via in contact with the source/drain contact. One example of a conductive via is the conductive via 113 of FIG. 1D. At 1108, the method 1100 includes forming, in the overlay mark region of an integrated circuit, a first diffraction grating of first metal structures with the first deposition process. One example of an overlay mark region is the overlay mark region 104 of FIG. 1A. One example of first metal structures are the first metal structures 110 of FIG. 1A. At 1110, the method 1100 includes forming, in the overlay mark region with the second deposition process, a second diffraction grating of second metal structures above and laterally offset from the first metal structures. One example of second metal structures is the second metal structures 112 of FIG. 1A.

Embodiments of the present disclosure provide a method and structure for improved alignment of features in wafer processing. Embodiments of the present disclosure provide an enhanced overlay mark region that enables improved diffraction-based (scatterometry) overlay measurements for alignment of a subsequent mask. When a wafer is processed, the wafer includes a device area corresponding to the functional circuitry of an integrated circuit and an overlay mark region that includes periodic structures or gratings that are used for diffraction-based scatterometry to enable alignment for formation of subsequent features. The overlay region includes semiconductor fins spaced apart from each other and extending in a first direction, dummy gate structures positioned between the semiconductor fins and extending in a same direction, a grating of first metal structures of source/drain contact material aligned over the semiconductor fins, and a grating of second metal structures of a conductive via material aligned over the dummy gate structures at a level higher than the first metal structures.

The use of the grating of first metal structures in the overlay mark region assist in ensuring that the second metal structures have a selected height after a subsequent chemical mechanical planarization (CMP) process. The selected height is a height sufficient to ensure that a subsequent diffraction-based overlay measurement process provides a strong signal that can be used for proper alignment of a subsequent mask used to form metal lines that contact the source/drain vias. The proper alignment results in metal lines that are reliably formed in contact with conductive vias. If the grating of first metal structures is not present at the overlay mark region, then after the CMP process the second metal structures may not have a sufficient height to enable a strong diffraction-based overlay measurement signal. Accordingly, the use of the grating of first metal structures in the mask overlay region results in better functioning integrated circuits and higher wafer yields.

In some embodiments, an integrated circuit includes a device region including a plurality of stacked channels of a transistor, a source/drain region of the transistor, a source/drain contact of a first material on the source/drain region, and a conductive via of a second material in contact with the source/drain contact. The integrated circuit includes an overlay mark region including a first diffraction grating of first metal structures of the first material and a second diffraction grating of second metal structures above of the second material above and offset from the first metal structures.

In some embodiments, an integrated circuit includes a substrate and an overlay mark region. The overlay mark region includes a plurality of semiconductor fins on the substrate, a first diffraction grating of first metal structures above and aligned with the semiconductor fins, and a second diffraction grating of second metal structures above and laterally offset from the first diffraction grating.

In some embodiments, a method includes forming, in a device region of an integrated circuit, a transistor including a plurality of stacked channels and a source/drain region, forming, in the device region with a first deposition process, a source/drain contact on the source/drain region, and forming, in the device region with a second deposition process, a conductive via in contact with the source/drain contact. The method includes forming, in the overlay mark region of an integrated circuit, a first diffraction grating of first metal structures with the first deposition process and forming, in the overlay mark region with the second deposition process, a second diffraction grating of second metal structures above and laterally offset from the first metal structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming, in a device region of an integrated circuit, a transistor including a plurality of stacked channels and a source/drain region;

forming, in the device region with a first deposition process, a source/drain contact on the source/drain region;

forming, in the device region with a second deposition process, a conductive via in contact with the source/drain contact;

forming, in an overlay mark region of the integrated circuit, a first diffraction grating of first metal structures with the first deposition process; and forming, in the overlay mark region with the second deposition process, a second diffraction grating of second metal structures above and laterally offset from the first metal structures.

2. The method of claim 1, further comprising performing a chemical mechanical planarization process on the second metal structures.

3. The method of claim 2, wherein the chemical mechanical planarization process utilizes a slurry that does not include potassium.

4. The method of claim 2, further comprising performing a diffraction-based overlay measurement process with the second diffraction grating after performing the CMP process.

5. The method of claim 4, further comprising forming, with a third deposition process, a first metal interconnect above and in contact with the conductive via.

6. The method of claim 5, further comprising forming, with the third deposition process, a third diffraction grating of third metal structures above the second metal structures and vertically aligned with the first metal structures.

7. The method of claim 6, further comprising forming, with a fourth deposition process, a second metal interconnect above the first metal interconnect.

8. The method of claim 7, further comprising forming a fourth diffraction grating of fourth conductive structures above the third diffraction grating of the overlay mark region.

9. The method of claim 1, wherein the first diffraction grating is vertically aligned with a plurality of semiconductor fins on a substrate.

10. The method of claim 9, further comprising forming a diffraction grating of conductive structures each on the substrate between a respective pair of semiconductor fins.

11. A method, comprising:

forming a plurality of stacked channels of a transistor in a device region of an integrated circuit;

forming, in the device region, a source/drain region of the transistor;

forming, in the device region, a source/drain contact of a first material on the source/drain region;

forming, in the device region, a conductive via of a second material in contact with the source/drain contact;

forming, in an overlay mark region of the integrated circuit, a first diffraction grating of first metal structures of the first material; and forming, in the overlay mark region, a second diffraction grating of second metal structures of the second material above and offset from the first metal structures.

12. The method of claim 11, further comprising:

depositing a first interlevel dielectric layer having a top surface that is substantially coplanar with top surfaces of the first metal structures; and depositing a second interlevel dielectric layer having a top surface that is substantially coplanar with top surfaces of the second metal structures.

13. The method of claim 12, further comprising forming a first metal interconnect of a third material above and in contact with the conductive via.

14. The method of claim 13, further comprising forming a third diffraction grating of third metal structures of the third material above the second metal structures and vertically aligned with the first metal structures.

15. The integrated circuit of claim 14, further comprising forming a second metal interconnect of a fourth material above the first metal interconnect.

16. The method of claim 15, further comprising forming a fourth diffraction grating of fourth conductive structures of the fourth material above the third diffraction grating in the overlay mark region.

17. The method of claim 11, further comprising forming a plurality of semiconductor fins below and aligned with the first diffraction grating.

18. A method, comprising:
forming a plurality of semiconductor fins on a substrate in an overlay mark region of an integrated circuit;
forming a first diffraction grating of first metal structures above and aligned with the semiconductor fins; and
forming a second diffraction grating of second metal structures above and laterally offset from the first diffraction grating.

19. The method of claim 18, further comprising forming, in a device region of the integrated circuit:
a plurality of stacked channels of a transistor;
a source/drain region of the transistor;
a source/drain contact on the source/drain region and of a same layer as the first metal structures; and
a conductive via in contact with the source/drain contact and of a same layer as the second metal structure.

20. The integrated circuit of claim 18, forming, in the overlay mark region, a third diffraction grating of third metal structures above the second metal structures.

* * * * *